US012595393B2

(12) United States Patent
Erickson et al.

(10) Patent No.: US 12,595,393 B2
(45) Date of Patent: Apr. 7, 2026

(54) CURABLE COMPOSITIONS FOR FORMING LIGHT SCATTERING LAYERS

(71) Applicant: 3M INNOVATIVE PROPERTIES COMPANY, St. Paul, MN (US)

(72) Inventors: Nicholas C. Erickson, St. Paul, MN (US); Stephen M. Menke, Eagan, MN (US); Evan L. Schwartz, Vadnais Heights, MN (US)

(73) Assignee: 3M INNOVATIVE PROPERTIES COMPANY, St. Paul, MN (US)

( * ) Notice: Subject to any disclaimer, the term of this patent is extended or adjusted under 35 U.S.C. 154(b) by 901 days.

(21) Appl. No.: 17/759,529

(22) PCT Filed: Jan. 28, 2021

(86) PCT No.: PCT/IB2021/050679
§ 371 (c)(1),
(2) Date: Jul. 27, 2022

(87) PCT Pub. No.: WO2021/156713
PCT Pub. Date: Aug. 12, 2021

(65) Prior Publication Data
US 2023/0165118 A1 May 25, 2023

Related U.S. Application Data

(60) Provisional application No. 62/971,452, filed on Feb. 7, 2020.

(51) Int. Cl.
*C09D 151/00* (2006.01)
*H10K 59/80* (2023.01)
(52) U.S. Cl.
CPC ....... *C09D 151/003* (2013.01); *H10K 59/873* (2023.02); *H10K 59/877* (2023.02)

(58) Field of Classification Search
CPC ............. C09D 151/003; H10K 59/873; H10K 59/877; H10K 59/35
See application file for complete search history.

(56) References Cited

U.S. PATENT DOCUMENTS 8,094,267 B2 * 1/2012 Higa ................... G02F 1/13363
349/122
9,093,666 B2 7/2015 Young et al.
(Continued)

FOREIGN PATENT DOCUMENTS

EP 2383817 A1 * 11/2011 ............. H10K 85/10

OTHER PUBLICATIONS

International Search Report for PCT International Application No. PCT/IB2021/050679, mailed on Apr. 22, 2021, 5 pages.
(Continued)

*Primary Examiner* — Ratisha Mehta
(74) *Attorney, Agent, or Firm* — Clifton F. Richardson

(57) ABSTRACT

An information display system includes a pixelated display including a plurality of pixels, each pixel including a plurality of subpixels, an inter-pixel region defined between two of the subpixels and at least one subpixel zone. Also included is an optically-scattering layer in optical communication with the pixelated display, the optically-scattering layer including: a matrix and phase-separated microdomains, wherein the matrix and the phase separated microdomains have different refractive indices and wherein the phase-separated microdomains are disposed in at least one subpixel zone.

20 Claims, 16 Drawing Sheets

(56) References Cited

U.S. PATENT DOCUMENTS

| | | | |
|---|---|---|---|
| 9,238,762 | B2 | 1/2016 | Schaffer et al. |
| 2006/0147177 | A1 | 7/2006 | Jing et al. |
| 2010/0259825 | A1 | 10/2010 | Yang et al. |
| 2015/0053951 | A1 | 2/2015 | Riegel et al. |

OTHER PUBLICATIONS

Szczepanski, "Spontaneous, Phase-Separation Induced Surface Roughness: A New Method to Design Parahydrophobic Polymer Coatings with Rose Petal-like Morphology", ACS Applied Materials & Interfaces, Feb. 2016, vol. 8, No. 5, pp. 3063-3071.

* cited by examiner

CURABLE COMPOSITIONS FOR FORMING LIGHT SCATTERING LAYERS

CROSS REFERENCE TO RELATED APPLICATIONS

This application is a national stage filing under 35 U.S.C. 371 of PCT/IB2021/050679, filed Jan. 28, 2021, which claims the benefit of U.S. Application No. 62/971,452, filed Feb. 7, 2020, the disclosure of which is incorporated by reference in its/their entirety herein.

FIELD OF THE DISCLOSURE

The present disclosure relates to optical light scattering layers that are formed from curable polymeric compositions.

BACKGROUND

Increasingly, optical devices involve more and more functional layers. As light travels through the layers of the optical device, the light can be altered by the layers in a wide variety of ways. For example, light can be reflected, refracted or absorbed. Frequently, layers are included in optical devices for more than one purpose. For example, a layer that is used as a spacer layer to separate two layers, which is a mechanical function, may also be called upon to provide an optical function such as transmitting or diffusing light.

SUMMARY

In some aspects, the present disclosure provides an information display system. The information display system can include a pixelated display including a plurality of pixels, each pixel including a plurality of subpixels, an inter-pixel region defined between two of the subpixels and at least one subpixel zone. The information display system can also include an optically-scattering layer in optical communication with the pixelated display. The optically-scattering layer can include: a matrix and phase-separated microdomains, wherein the matrix and the phase separated microdomains have different refractive indices. Further, the phase-separated microdomains can be disposed in at least one subpixel zone.

BRIEF DESCRIPTION OF THE DRAWINGS

The present application may be more completely understood in consideration of the following detailed description of various embodiments of the disclosure in connection with the accompanying drawings.

Figures 1A, 1B, 1C, 1D:
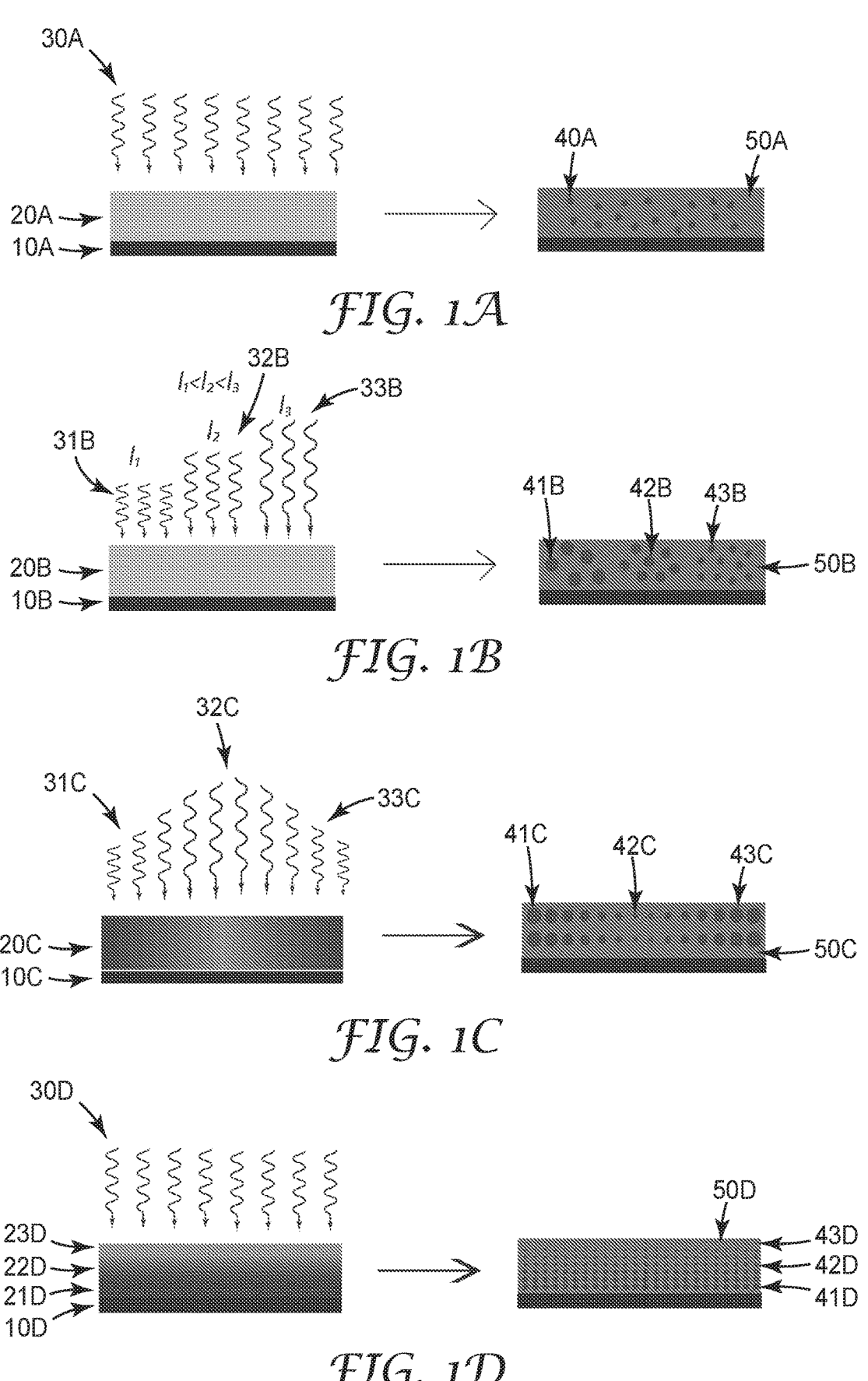
FIG. 1A shows a schematic of a process of this disclosure for forming an optical light scattering article.
FIG. 1B shows a schematic of another process of this disclosure for forming an optical light scattering article.
FIG. 1C shows a schematic of another process of this disclosure for forming an optical light scattering article.
FIG. 1D shows a schematic of another process of this disclosure for forming an optical light scattering article.

In the following description of the illustrated embodiments, reference is made to the accompanying drawings, in which is shown by way of illustration, various embodiments in which the disclosure may be practiced. It is to be understood that the embodiments may be utilized and structural changes may be made without departing from the scope of the present disclosure. The figures are not necessarily to scale. Like numbers used in the figures refer to like components. However, it will be understood that the use of a number to refer to a component in a given figure is not intended to limit the component in another figure labeled with the same number.

DETAILED DESCRIPTION

The increased complexity of optical devices place increasingly difficult to meet requirements upon the materials used in them. In particular, organic polymeric materials have found widespread use in optical devices, but increasing stringent requirements are being placed upon these polymeric materials.

For example, thin organic polymeric films are desirable for a wide range of uses in optical devices, as adhesives, protective layers, spacer layers, and the like. As articles have become more complex, the physical demands upon these layers have increased. For example, as optical devices have become more compact, and at the same time often include more layers, there has been an increasing need for thinner layers. At the same time, since the layers are thinner, the layers also need to be more precise. For example, a thin spacer layer (of 1 micrometer thickness) in order to be effective as a spacer needs to be level and free of gaps and holes in order to provide the proper spacing function. This requires deposition of the organic layer in a precise and consistent manner. Among the methods that have been developed to provide a precise and consistent deposition of organic polymeric material are printing techniques. In printing techniques, a polymer or a curable composition that upon curing forms a polymer is printed onto a substrate surface to form a layer. In the case of printable polymers, typically solvents are added to make the polymer a solution or dispersion capable of being printed. When polymers are used, typically a drying step is necessary after printing to produce the desired polymeric layer. In the case of curable compositions that upon curing form polymers, the curable compositions may or may not include a solvent. The curable composition is then cured, typically either with the application of heat or radiation (such as UV light) and if a solvent is used the layer may also be dried. A wide variety of printing techniques can be used, with inkjet printing being particularly desirable because of the excellent precision of inkjet printing.

Additionally, not only do these layers have to supply their physical role (adhesion, protection, spacing, and the like) they must also provide the requisite optical properties. One optical property that is becoming increasing important is light diffusion. Typically, light diffusion has been achieved through the use of particles. Light diffusing particles are dispersed within a polymerizable binder to form a curable mixture, the curable mixture is disposed on a surface and cured to form a layer with light diffusing particles suspended in the polymerized matrix.

While this approach for preparing light diffusing layers has been widely used it has serious drawbacks and limitations. The addition of pre-formed particles and fillers can be problematic, not only because of the complications of backscatter, but also because the addition of such particles and fillers make the filtration process more difficult, a process frequently desirable to improve the uniformity of the coating. Additionally, as the layers have become thinner and thinner, techniques such as inkjet printing are used more and more to dispose the curable layer onto a surface, and printing of pre-formed particle-filled mixtures can be very difficult as the pre-formed particles tend to clog the printhead nozzles. Additionally, while uniform diffusing layers can be made in this way, that is to say, layers that have the same diffusing property across the entire area of the layer, it is very difficult, if not impossible, to create selectively-diffusive layers in this way. Selectively-diffusive layers as used herein, refers to layers that have different diffusive properties in different areas of the layer.

Other techniques have been used to provide scattering layers without the use of pre-formed particles for optical applications.

Yang et al., (US 2010/0259825) blends two incompatible monomers into an emulsion, coats and then cures to lock in that morphology. This does not allow for control of morphology during the cure. Rather, the control of morphology is performed prior to the cure by changing the amount and/or speed of mixing prior to dispense. Emulsions require stabilizers and other chemical components in order to maintain stability and control over the size of the microdomains formed, which may decrease the refractive index difference possible between the two phases, and thus the amount of scattering that is able to be achieved. Control over the size of these phases beyond the initial emulsifying was not demonstrated.

Young et al., (U.S. Pat. No. 9,093,666) also describes a phase separating solution of two different epoxysilicone monomers mixed with a non-silicone containing cycloaliphatic epoxy monomer and photoinitiator. One of the epoxysilicone resins used is immiscible with the cycloaliphatic epoxy resin prior to curing, and stirring is used to effect different particle size distributions in the range of 0.5 to 20 micrometers prior to curing. This layer was applied as an encapsulation layer in between two inorganic layers in order to enhance light outcoupling of an OLED device. No control over the extent of phase separation during the curing step is demonstrated or discussed.

Mazurek et al., (U.S. Pat. No. 8,343,633B2) uses a radiation curable telechelic silicone-containing monomer dissolved in a non-silicone-containing radiation curable monomer.

In this approach the two phases are miscible with each other before curing, but then phase separate upon curing. Some degree of control over the size of the microdomains is demonstrated during the curing step, although since both of the phases contain crosslinkable (meth)acrylate moieties, crosslinking between the phases is allowed to occur, thereby limiting diffusion and the extent of phase separation.

Another technique that has been used to prepare light diffusing pressure sensitive adhesives without the use of added particles, is described in U.S. Pat. No. 9,238,762 (Schaffer et al.). In this application, block copolymers are dissolved in solvent with an optically clear pressure sensitive adhesive matrix. The block copolymers phase-separate from the polymer used for the pressure sensitive adhesive after drying of the solvent. The block copolymer formed microdomains are larger than the wavelength of visible light and thus diffuse visible light. No control over the degree of phase separation during the drying step was discussed or demonstrated and the distribution of microdomain sizes are the same at all points along the layer.

The current disclosure differs from these in that a non-polymerizable amorphous fluoropolymer, typically a fluoroelastomer, is dissolved within an organic radiation curable monomer mixture to form an initially clear, miscible solution. On curing the fluoropolymer phase separates from the methacrylate phase, providing a change in refractive index which allows for sufficient optical scattering. Since the polymer does not copolymerize with the monomer during the cure, this allows for greater amount of control over the diffusion that is required for sufficient phase separation. For example, the ability to control particle sizes during the curing step by changing the light intensity used during the cure, and thereby affecting the rate of polymerization has been demonstrated. Furthermore, it was surprising that fluoropolymers could be dissolved in (non-fluorine containing) (meth)acrylate monomers, two materials with very different chemical structures. The use of such chemically different materials allows for a large difference in refractive index afforded by each of the components after the phase separation occurs. Lastly, the ability to control phase separation during the curing step allows for the possibility to create multiple different domain sizes within one layer using patterning methods well known in the art, which may be beneficial in certain applications.

The present disclosure provides a curable composition that is free of particles and is able to form a light diffusing layer. The curable composition includes a fluoropolymer and (meth)acrylates along with a free-radical initiator and forms a homogenous single phase prior to curing. Typically, the fluoropolymer has good miscibility with the (meth)acrylate monomers, and thus the uncured composition layer does not contain fluorocarbon-rich microdomains, rather the fluoropolymer/(meth)acrylate mixture is essentially homogeneous and is transparent. The terms fluoropolymer and fluorocarbon are used interchangeably to refer to the fluorine-containing polymers of this disclosure. Upon activation of the photoinitiator by UV irradiation, free-radicals are created within the film which induces polymerization of the (meth)acrylate monomers and leads to a phase separation of either the fluoropolymer or poly(meth)acrylate into discrete domains due to the reduction in entropy and increase in free energy of mixing between the two components. Because of the refractive index differential between the poly(meth)acrylate and fluoropolymer, the formation of phase separated microdomains leads to increased forward scattering of light (also known as "haze"). When a ray of light is forward-scattered, the light is diffused, but continues in the same general incident direction. In back scattering, the light is directed back in the incident direction. Thus, in back scattering some of the light intensity is lost due to the reflection back towards the source. In forward scattering, only a small amount of light is lost due to reflection, since most of the light is transmitted in the incident direction, it is just diffused. This is desirable in instances where a point light source is used which would create a bright spot where light from the point source is present and adjacent unlit spots where no light is transmitted. By using a forward-scattering diffuser, the light from the point source is spread out over a greater area eliminating the bright spot/unlit spot phenomenon. Forward scattering and back scattering are well understood by one of skill in the art.

The light diffusing layer is prepared by disposing a curable composition onto a substrate and curing the curable composition to form a cured organic layer with a matrix and phase separated microdomains, where the matrix and the phase separated microdomains have different refractive indices. This process, curing of miscible composition to form a cured composition with phase separated domains is sometimes referred to as PIPS (polymerization-induced phase separation). In the present application, the domain sizes are large enough to diffuse visible light, in other words they have average diameters on the order of or larger than the wavelengths of visible light (about 400-700 nm). The PIPS model suggests that one might expect that the matrix would be a crosslinked (meth)acrylate matrix with microdomains of fluoropolymer. While this does occur, as will be explained in greater detail below, the formed cured organic layer is far more complex than a simple crosslinked (meth)acrylate matrix with microdomains of fluoropolymer. What has been discovered is that the cured organic layer comprises at least one of three different compositional types or compositional regions. Each of the regions comprises a matrix and phase-separated microdomains. The first region is a region where the essentially continuous matrix comprises a crosslinked (meth)acrylate matrix and phase separated fluorocarbon-rich microdomains, where the fluorocarbon-rich microdomains are predominantly if not essentially all fluorocarbon. This embodiment region is described above. The second region is a region where the essentially continuous matrix comprises a crosslinked (meth)acrylate matrix and the phase separated microdomains comprise (meth)acrylate materials as well as the fluoropolymer. In these embodiments, the microdomains can still be described as fluoropolymer-rich microdomains, but they comprise nanodomains of fluoropolymer and nanodomains of crosslinked (meth)acrylate. The third region is a region where the essentially continuous matrix comprises a fluorocarbon-rich domain and the phase separated microdomains are (meth)acrylate-rich, where the (meth)acrylate-rich microdomains comprise at least cross-linked (meth) acrylate materials, and may also contain fluoropolymer.

The optically-scattering layer comprises at least one of the regions described above. In some embodiments, the optically-scattering layer is all of one region and is essentially uniform throughout. In other embodiments, the optically-scattering layer comprises more than one region. This phenomenon of different regions is different from the selective diffusion properties described below, and refers to the composition of the matrix and phase separated microdomains.

Another feature of the present disclosure is the ability to use selective curing to create selectively-diffusive layers. Selectively-diffusive layers as used herein, refers to layers that have different diffusive properties in different areas of the layer. This selectivity is described in greater detail below and can be effected in a wide variety of ways such as by using variable intensity light sources, and masking techniques.

Disclosed herein are curable compositions comprising at least one fluoropolymer, at least one monofunctional (meth) acrylate, at least one difunctional (meth)acrylate, and at least one initiator. The curable composition typically has a viscosity of less than 30 centipoise at a temperature of from room temperature to 60° C. This viscosity permits the curable composition to be printed by techniques such as inkjet printing techniques, but of course a wide variety of coating techniques can be used to coat the curable compositions.

Also disclosed herein are articles that contain cured layers prepared from curable compositions, where the cured layers comprise a matrix and phase separated microdomains where the matrix and the phase separated microdomains have different refractive indices, and where at least some of the microdomains are on the order of or larger than the wavelengths of visible light and thus are able to diffuse visible light. Additionally, methods of preparing such articles are described.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein. The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. For example, reference to "a layer" encompasses embodiments having one, two or more layers. As used in this specification and the appended claims, the term "or" is generally employed in its sense including "and/or" unless the content clearly dictates otherwise.

As used herein, the term "adjacent" refers to two layers that are proximate to another layer. Layers that are adjacent may be in direct contact with each other, or there may be an intervening layer. There is no empty space between layers that are adjacent.

The curable ink compositions are "substantially solvent free" or "solvent free". As used herein, "substantially solvent free" refers to the curable ink compositions having less than 5 wt-%, 4 wt-%, 3 wt-%, 2 wt-%, 1 wt-% and 0.5 wt-% of non-polymerizable (e.g. organic) solvent. The concentration of solvent can be determined by known methods, such as gas chromatography (as described in ASTM D5403). The term "solvent free" as it implies that no solvent is present in the composition. It should be noted that whether the curable ink composition is substantially solvent free or solvent free, no solvent is deliberately added.

Typically, the curable ink compositions are described as "100% solids". As used herein, "100% solids" refers to curable ink compositions that do not contain volatile solvents such that all of the mass that is deposited on a surface remains there, and no volatile mass is lost from the coating.

As used herein, the term "polymer" refers to a material that is a macromolecule, and may be a homopolymer or a copolymer. As used herein, the term "homopolymer" refers to a polymeric material that is the reaction product of one monomer. As used herein, the term "copolymer" refers to a polymeric material that is the reaction product of at least two different monomers.

The terms "Tg" and "glass transition temperature" are used interchangeably. If measured, Tg values are determined by Differential Scanning calorimetry (DSC) at a scan rate of 10° C./minute, unless otherwise indicated. Typically, Tg values for copolymers are not measured but are calculated using the well-known Fox Equation, using the monomer Tg values provided by the monomer supplier, as is understood by one of skill in the art.

The terms "room temperature" and "ambient temperature" are used interchangeably and have their conventional meaning, referring to temperatures of 20-25° C.

The term "organic" as used herein to refer to a cured layer, means that the layer is prepared from organic materials and is free of inorganic materials.

The terms "fluoropolymer" or "fluorinated polymer" are used interchangeably and refer to a fluorocarbon-based polymer with multiple carbon-fluorine bonds. Fluoropolymers are hydrocarbon polymers in which hydrogen atoms, typically many hydrogen atoms, or even all hydrogen atoms, have been replaced by fluorine atoms. Examples of fluoropolymers are "fluoroelastomers". A fluoroelastomer is a special purpose fluorocarbon-based synthetic rubber that does not contain a substantial amount of crystallinity.

The term "(meth)acrylate" refers to monomeric acrylic or methacrylic esters of alcohols. Acrylate and methacrylate monomers or oligomers are referred to collectively herein as "(meth)acrylates". The term "(meth)acrylate-based" as used herein refers to a polymeric composition that comprises at least one (meth)acrylate monomer and may contain additional (meth)acrylate or non-(meth)acrylate co-polymerizable ethylenically unsaturated monomers. Polymers that are (meth)acrylate based comprise a majority (that is to say greater than 50% by weight) of (meth)acrylate monomers.

The terms "free radically polymerizable" and "ethylenically unsaturated" are used interchangeably and refer to a reactive group which contains a carbon-carbon double bond which is able to be polymerized via a free radical polymerization mechanism.

The term "hydrocarbon group" as used herein refers to any monovalent group that contains primarily or exclusively carbon and hydrogen atoms. Alkyl and aryl groups are examples of hydrocarbon groups.

The term "alkyl" refers to a monovalent group that is a radical of an alkane, which is a saturated hydrocarbon. The alkyl can be linear, branched, cyclic, or combinations thereof and typically has 1 to 20 carbon atoms. In some embodiments, the alkyl group contains 1 to 18, 1 to 12, 1 to 10, 1 to 8, 1 to 6, or 1 to 4 carbon atoms. Examples of alkyl groups include, but are not limited to, methyl, ethyl, n-propyl, isopropyl, n-butyl, isobutyl, tert-butyl, n-pentyl, n-hexyl, cyclohexyl, n-heptyl, n-octyl, and ethylhexyl.

The term "aryl" refers to a monovalent group that is aromatic and carbocyclic. The aryl can have one to five rings that are connected to or fused to the aromatic ring. The other ring structures can be aromatic, non-aromatic, or combinations thereof. Examples of aryl groups include, but are not limited to, phenyl, biphenyl, terphenyl, anthryl, naphthyl, acenaphthyl, anthraquinonyl, phenanthryl, anthracenyl, pyrenyl, perylenyl, and fluorenyl.

The term "alkylene" refers to a divalent group that is a radical of an alkane. The alkylene can be straight-chained, branched, cyclic, or combinations thereof. The alkylene often has 1 to 20 carbon atoms. In some embodiments, the alkylene contains 1 to 18, 1 to 12, 1 to 10, 1 to 8, 1 to 6, or 1 to 4 carbon atoms. The radical centers of the alkylene can be on the same carbon atom (i.e., an alkylidene) or on different carbon atoms.

The term "heteroalkylene" refers to a divalent group that includes at least two alkylene groups connected by a thio, oxy, or —NR— where R is alkyl. The heteroalkylene can be linear, branched, cyclic, substituted with alkyl groups, or combinations thereof.

Some heteroalkylenes are polyoxyalkylenes where the heteroatom is oxygen such as for example, $$—CH_2CH_2(OCH_2CH_2)_nOCH_2CH_2—.$$

The term "alicyclic" as used herein refers to a group that is both aliphatic and cyclic in nature, containing one or more all-carbon rings which may be saturated or unsaturated, but are not aromatic in character, and may be substituted by one or more alkyl groups.

Unless otherwise indicated, "optically transparent" refers to a layer, film, or article that has a high light transmittance over at least a portion of the visible light spectrum (about 400 to about 700 nm). Typically, optically transparent layers, films, or articles have a luminous transmission of at least 90%.

Unless otherwise indicated, "optically clear" refers to a layer, film, or article that has a high light transmittance over at least a portion of the visible light spectrum (about 400 to about 700 nm), and that exhibits low haze. Typically, optically clear layers, films, or articles have visible light transmittance values of at least 90%, often at least 95%, and haze values of 5% or less, often 2% or less. Luminous transmission and haze can be measured using the techniques described in the Examples section.

Disclosed herein are curable compositions, articles prepared using the curable compositions and methods of preparing the articles that use the curable compositions. The curable compositions of this disclosure provide a methodology for selectively preparing an optically-scattering layer. By optically-scattering it is meant that the layer forward scatters visible light. As described above, optically-scattering layers are ones that act to diffuse visible light. The diffusion of visible light occurs because the curable compositions, when cured, form phase separated microdomains within a matrix, and the matrix and phase separated microdomains have different refractive indices. In the present disclosure, the phase separated microdomains are on the same order as or larger than the wavelengths of visible light. Since visible light is generally characterized as having wavelengths of from 400-700 nanometers, the phase separated microdomains are generally at least 100 nm or larger, often 100-4,000 nm. The microdomains are either "fluoropolymer-rich", meaning that they have a high concentration of fluoropolymer but are not necessarily composed entirely of fluoropolymer, within a (meth)acrylate matrix or are "(meth)acrylate-rich" meaning that they have a high concentration of (meth)acrylate but are not necessarily composed entirely of (meth)acrylate, within a fluoropolymer-rich matrix. The presence of microdomains with a different refractive index than the surrounding matrix means that when visible light passing through the matrix encounters the microdomain it will be refracted or scattered due to this refractive index mismatch, as is described by Snell's Law. This scattering is often referred to as forward scattering or haze. As described above, forward scattering is desirable since it results in diffused light with little loss of light intensity.

In the present disclosure, curable compositions are provided that contain fluoropolymers and curable (meth)acrylate monomers. These curable compositions are optically transparent or even optically clear, as the fluoropolymers have a high miscibility with the (meth)acrylate monomers. The curable compositions are also of a relatively low viscosity, permitting them to be coated in a variety of methods including inkjet printing. Upon curing of the curable compositions, the curable composition forms a cured organic layer with a matrix and phase separated microdomains where the matrix and the phase separated microdomains have different refractive indices, and at least some of the phase separated microdomains are on the order of or larger than the wavelength of visible light (400-700 nm). In some embodiments, the phase separated microdomains are in the range of 100-4,000 nm. Also disclosed herein are methods for preparing articles with optically-scattering layers.

Disclosed herein are curable compositions. The curable compositions comprise at least one fluoropolymer, at least one monofunctional (meth)acrylate, at least one difunctional (meth)acrylate, and at least one initiator. The curable composition typically has a viscosity of less than 30 centipoise at a temperature of from room temperature to 60° C. Typically, the curable composition is free from solvent. In many embodiments, the curable composition is optically transparent or even optically clear. An advantage of these relatively low viscosity compositions is that they are inkjet printable. By inkjet printable it is meant that the compositions are capable of being inkjet printed and does not mean that the compositions must be inkjet printed or that the compositions have been inkjet printed. In this way, the expression inkjet printable is a compositional limitation of the curable composition and is not a process limitation. Inkjet printable materials can be coated in a variety of ways.

The curable compositions include at least one fluoropolymer. A fluoropolymer is a fluorocarbon-based polymer with multiple carbon-fluorine bonds. It is characterized by a high resistance to solvents, acids, and bases. Fluoropolymers are hydrocarbon polymers in which hydrogen atoms, typically many hydrogen atoms, or even all hydrogen atoms, have been replaced by fluorine atoms.

Fluoropolymers share the properties of fluorocarbons in that they are not as susceptible to the van der Waals force as hydrocarbons. Thus, fluoropolymers, like fluorocarbons, are very stable because of the strength of the carbon-fluorine bond, one of the strongest in organic chemistry. Its strength is a result of the electronegativity of fluorine imparting partial ionic character through partial charges on the carbon and fluorine atoms, which shorten and strengthen the bond through favorable covalent interactions. Additionally, multiple carbon-fluorine bonds increase the strength and stability of other nearby carbon-fluorine bonds on the same geminal carbon, as the carbon has a higher positive partial charge. Furthermore, multiple carbon-fluorine bonds also strengthen the "skeletal" carbon-carbon bonds from the inductive effect. Therefore, saturated fluorocarbons are more chemically and thermally stable than their corresponding hydrocarbon counterparts, and indeed any other organic compound. They are generally not miscible with most organic solvents (e.g., ethanol, acetone, ethyl acetate, and chloroform), but are miscible with some hydrocarbons (e.g., hexane in some cases). They have low refractive indices, typically less than 1.45.

The curable compositions of this disclosure comprise at least one fluoropolymer that comprises 1-20 weight % based upon 100 weight % of total curable composition. Examples of suitable fluoropolymers are amorphous fluoropolymers comprising 60-70% fluorine content. By fluorine content, it is meant that the 60-70% of the substitutable hydrogen atoms have been replaced by fluorine groups. One particularly suitable class of fluoropolymers are fluoroelastomers. A fluoroelastomer is a special purpose fluorocarbon-based synthetic rubber that is amorphous, and does not contain a substantial amount of crystallinity. It has wide chemical resistance and superior performance, especially in high temperature application in different media. Fluoroelastomers are categorized under the ASTM D1418 & ISO 1629 designation of FKM. This class of elastomers is a family comprising copolymers of hexafluoropropylene (HFP) and vinylidene fluoride (VDF or VF2), terpolymers of tetrafluoroethylene (TFE), vinylidene fluoride (VDF) and hexafluoropropylene (HFP) as well as perfluoromethylvinylether (PMVE) containing specialties. Particularly suitable fluoroelastomers are copolymers of vinylidene fluoride (VDF) and hexafluoropropylene (HFP), such as the materials commercially available from 3M Company, St. Paul, MN as FC 2145, FC 2178, and FC 2211.

As mentioned above, fluoropolymers generally have low miscibility with organic solvents and fluids. In the present disclosure, it has been observed that in the curable compositions the fluoropolymers have a high miscibility with the (meth)acrylate monomers containing cyclic moieties. In fact, in many embodiments the curable compositions are optically clear. Other fluoropolymers that may be used are described in Jing et al., (US 2006/0147177 A1).

One desirable feature of the fluoropolymers is that they have a refractive index which is different from the (meth) acrylate matrix that is formed by the polymerization of the (meth)acrylate monomers described below. The fluoropolymers typically have a refractive index in the range of 1.40-1.41. This refractive index is different from the refractive index of (meth)acrylate matrices which typically are in the range 1.48-1.50.

The curable composition also includes at least one monofunctional (meth)acrylate. A wide range of monofunctional (meth)acrylates are suitable. In some embodiments, the monofunctional (meth)acrylate comprises a monofunctional methacrylate. In some embodiments, methacrylates are more desirable than acrylates because methacrylates polymerize more slowly, allowing for a more controlled reaction speed and thus more control over the diffusion properties of the resulting film. Examples include, but are not limited to, acrylamides, such as acrylamide, methacrylamide, N-methyl acrylamide, N-ethyl acrylamide, N-hydroxyethyl acrylamide, diacetone acrylamide, N,N-dimethyl acrylamide, N, N-diethyl acrylamide, N-ethyl-N-aminoethyl acrylamide, N-ethyl-N-hydroxyethyl acrylamide, N,N-dihydroxyethyl acrylamide, t-butyl acrylamide, N,N-dimethylaminoethyl acrylamide, and N-octyl acrylamide. Examples of suitable monofunctional (meth)acrylates include alicyclic methacrylates. Alicyclic compounds are organic compounds that are both aliphatic and cyclic. They contain one or more all-carbon rings which may be either saturated or unsaturated, but do not have aromatic character. Alicyclic compounds may have one or more aliphatic side chains attached. In some embodiments, the alicyclic compounds may include one or more heteroatoms. Monocyclic cycloalkanes and cycloalkenes include cyclopentane, cyclopentene, cyclohexane, cyclohexene, cycloheptane, cycloheptene, cyclooctane, cyclooctene, and so on. Bicyclic alkanes and alkenes include norbornane, norbornene, and norbornadiene. Examples of suitable alicyclic (meth)acrylates include 3,3, 5-trimethyl cyclohexyl acrylate and methacrylate, 1-adamantyl acrylate and methacrylate, 3,5-dimethyl adamantyl acrylate and methacrylate, and isobornyl acrylate and methacrylate. Examples of heteroatom-functional alicyclic (meth)acrylates include tetrahydrofurfuryl acrylate and methacrylate. The mono-functional (meth)acrylate may be present in a wide range of amounts. In some embodiments the mono-functional (meth)acrylate comprises 60-95 parts by weight based upon the total weight of the curable components of the curable composition.

It is also possible to use monomers that contain unsaturation in the form of a vinyl group. These are well known in the art to chemically react and crosslink in to (meth)acrylate matrices. Preferred examples of vinyl-containing monomers which also include cyclic moiety include n-vinyl pyrrolidone and n-vinyl caprolactam. Suitable ranges of vinyl-containing monomers include 1 to 20 parts by weight based upon the total weight of the curable components of the curable composition.

The curable composition also includes at least one multi-functional (meth)acrylate. In some embodiments, the multi-functional (meth)acrylate comprises a difunctional (meth) acrylate. In some embodiments, the difunctional (meth) acrylate comprises a difunctional methacrylate. Again, as with the monofunctional (meth)acrylate, difunctional methacrylates can be particularly suitable because they polymerize more slowly than the corresponding acrylates, allowing for more control over the polymerization rate.

Examples of suitable difunctional (meth)acrylates include aliphatic (meth)acrylates of general Formula I:

$$H_2C=CR2\text{-}(CO)\text{---}O\text{-}A\text{-}O\text{---}(CO)\text{---}R2C=CH_2 \qquad \text{Formula I}$$

where R2 is hydrogen or methyl, (CO) is a carbonyl group C=O, and A is divalent group comprising an alkylene or a heteroalkylene group. Examples of alkylene groups include ones with 4-20 carbon atoms, and may include cyclic groups. Examples of heteroalkylene groups include polyethylene oxide groups, polypropylene oxide groups, and the like. Examples of useful multifunctional (meth)acrylate include, but are not limited to 1,6-hexanediol di(meth)acrylate, 1,4-butanediol di(meth)acrylate, propylene glycol di(meth)acrylates, ethylene glycol di(meth)acrylates, hydroxy pivalic acid neopentyl glycol di(meth)acrylate, neopentyl glycol di(meth)acrylate, bisphenol A di(meth)acrylates, tricyclodecane dimethanol di(meth)acrylate, poly(ethylene glycol) di(meth)acrylates, polybutadiene di(meth)acrylate, polyurethane di(meth)acrylates, glycerin tri(meth) acrylate, trimethylolpropane tri(meth)acrylate, tris(2-hydroxyethyl)isocyanurate triacrylate, pentaerythritol tri- and tetra(meth)acrylate, ditrimethylolpropane tetra (meth)acrylate, dipentaerythritol penta(meth)acrylate, dipentaerythritol hexa(meth)acrylate, and ethoxylated and propoxylated versions and mixtures thereof.

The multi-functional (meth)acrylate, or crosslinker, may be present in a wide range of amounts. In some embodiments the multi-functional (meth)acrylate comprises 1-20 parts by weight based upon the total weight of the curable components of the curable composition. The amount and identity of the crosslinker or crosslinkers can vary, but typically the total amount of crosslinkers are present in an amount of at least 5 weight %. By weight % it is meant the % by weight of the total curable components of the curable ink composition.

The curable composition also comprises at least one initiator. Typically, the initiator is a photoinitiator, meaning that the initiator is activated by light, typically ultraviolet (UV) light. Photoinitiators are well understood by one of skill in the art of (meth)acrylate polymerization.

Useful photoinitiators include those known as useful for photocuring free-radically polyfunctional (meth)acrylates. Exemplary photoinitiators include benzoin and its derivatives such as alpha-methylbenzoin; alpha-phenylbenzoin; alpha-allylbenzoin; alpha benzylbenzoin; benzoin ethers such as benzil dimethyl ketal (e.g., "OMNIRAD BDK" from IGM Resins USA Inc., St. Charles, IL), benzoin methyl ether, benzoin ethyl ether, benzoin n-butyl ether; acetophenone and its derivatives such as 2-hydroxy-2-methyl-1-phenyl-1-propanone (e.g., available under the trade designation OMNIRAD 1173 from IGM Resins USA Inc., St. Charles, IL) and 1-hydroxycyclohexyl phenyl ketone (e.g., available under the trade designation OMNIRAD 184 from IGM Resins USA Inc., St. Charles, IL); 2-methyl-1-[4-(methylthio)phenyl]-2-(4-morpholinyl)-1-propanone (e.g., available under the trade designation OMNIRAD 907 from IGM Resins USA Inc., St. Charles, IL); 2-benzyl-2-(dimethylamino)-1-[4-(4-morpholinyl)phenyl]-1-butanone (e.g., available under the trade designation OMNIRAD 369 from IGM Resins USA Inc., St. Charles, IL) and phosphine oxide derivatives such as ethyl-2,4,6-trimethylbenzoylphenyl phosphinate (e.g. available under the trade designation TPO-L from IGM Resins USA Inc., St. Charles, IL), and bis-(2,4,6-trimethylbenzoyl)-phenylphosphineoxide (e.g., available under the trade designation OMNIRAD 819 from IGM Resins USA Inc., St. Charles, IL).

Other useful photoinitiators include, for example, pivaloin ethyl ether, anisoin ethyl ether, anthraquinones (e.g., anthraquinone, 2-ethylanthraquinone, 1-chloroanthraquinone, 1,4-dimethylanthraquinone, 1-methoxyanthraquinone, or benzanthraquinone), halomethyltriazines, benzophenone and its derivatives, iodonium salts and sulfonium salts, titanium complexes such as bis(eta-2,4-cyclopentadien-1-yl)-bis[2,6-difluoro-3-(1H-pyrrol-1-yl) phenyl]titanium (e.g., available under the trade designation CGI 784DC from BASF, Florham Park, NJ); halomethyl-nitrobenzenes (e.g., 4-bromomethylnitrobenzene), and combinations of photoinitiators where one component is a mono- or bis-acylphosphine oxide (e.g., available under the trade designations IRGACURE 1700, IRGACURE 1800, and IRGACURE 1850 from BASF, Florham Park, NJ, and under the trade designation OMNIRAD 4265 from IGM Resins USA Inc., St. Charles, IL).

Generally, the photoinitiator is used in amounts of 0.01 to 5 parts by weight, more typically 0.1 to 0.5, parts by weight relative to 100 parts by weight of total reactive components.

The curable composition may include additional optional additives. The optional additives may be reactive or nonreactive. A higher difference in refractive index ($\Delta n$) between the minority and majority phase would increase the haze and scattering power of the film. This would enable the use of less fluoropolymer in order to achieve the same optical effect as a larger amount of fluoropolymer with smaller ($\Delta n$). Less fluoropolymer would enable a lower viscosity ink formulation, which would also be beneficial for inkjet performance. Metal oxide nanoparticles would be especially useful to increase the refractive index of the poly(meth)acrylate matrix phase.

A wide range of metal oxide nanoparticles are suitable, but as mentioned above, metal oxide nanoparticles with a high refractive index are desirable since the desire is to raise the refractive index of the curable ink compositions. Examples of suitable metal oxide nanoparticles include metal oxides of titanium, aluminum, hafnium, zinc, tin, cerium, yttrium, indium, antimony, and zirconium, as well as mixed metal oxides such as, for example, indium tin oxide. In this context, a high refractive index refers to a refractive index of 2.0 or higher. Among the more desirable metal oxide nanoparticles are those of titanium, aluminum, and zirconium. Particularly suitable because of its high refractive index are nanoparticles of titanium oxide commonly referred to as titania nanoparticles. In many instances a single type of metal oxide nanoparticle is used, but mixtures of metal oxide nanoparticle may also be used.

As mentioned before, the size of such particles is chosen to avoid significant visible light scattering. The surface-treated metal oxide nanoparticles can be particles having a (e.g. unassociated) primary particle size or associated particle size of greater than 1 nm, 5 nm or 10 nm. The primary or associated particle size is generally less than 100 nm, 75 nm, or 50 nm. Typically, the primary or associated particle size is less than 40 nm, 30 nm, or 20 nm. It is desirable that the nanoparticles are unassociated and remain unassociated over time. Their measurements can be based on transmission electron microscopy (TEM) or dynamic light scattering (DLS).

Zirconia and titania nanoparticles can have a particle size from 5 to 50 nm, or 5 to 15 nm, or 8 nm to 12 nm. Suitable zirconias (nanoparticles of zirconium dioxide) are available from Nalco Chemical Co. under the trade designation "Nalco OOSSOO8" and from Buhler AG Uzwil, Switzerland under the trade designation "Buhler zirconia Z—WO sol". Titania nanoparticles (nanoparticles of titanium dioxide) are particularly suitable. Titania nanoparticles containing a mixture of anatase and brookite crystal structures are commercially available from Showa Denko Corp. of Japan as "NTB-1".

The nanoparticles are preferably surface-treated to improve compatibility with the organic matrix material and to keep the nanoparticles non-associated, non-agglomerated, or a combination thereof in the curable ink composition. The surface treatment used to generate the surface-treated nanoparticles is a silane surface treatment agent comprising at least two silane-functional surface treatment agents.

Another particularly suitable optional additive is an adhesion promoter. An adhesion promoter is used as an additive or as a primer to promote adhesion of coatings, inks, or adhesives to the substrate of interest. An adhesion promoter usually has an affinity for the substrate and the applied coating, ink, or adhesive. Among the suitable adhesion promoters are silane-functional compounds, titanates, and zirconates. Examples of suitable titanates and zirconates include titanium or zirconium butoxide. Typically, if used, the adhesion promoter comprises a silane-functional compound. Sometimes silane-functional adhesion promoters are called coupling agents since they have different functionality at each end of the compound and thus can act to couple different surfaces such as inorganic surfaces and organic surfaces. A wide variety of silane adhesion promoters are suitable such as the (meth)acrylate-functional alkoxy silane SILQUEST A-174 from Momentive Performance Materials. With this type of adhesion promoter, the alkoxy silane functionality interacts with an inorganic surface and the (meth)acrylate-functionality co-polymerizes with the curable ink composition. Other examples of silane coupling agents that are suitable include octadecyltrimethoxysilane, isooctyltrimethoxysilane, hexadecyltrimethoxysilane, hexyltrimethoxysilane, methyl trimethoxysilane, hexamethyldisilazane, hexamethyldisiloxane, aminopropyltrimethoxysilane, 3-mercaptopropyltrimethoxysilane, glycidoxypropyltrimethoxysilane, 3-acryloxypropyltrimethoxysilane and the like.

Useful additives may comprise polymers containing functional groups known in the art, such as epoxide groups, allyloxy groups, (meth)acrylate groups, (meth)acrylamide groups, epoxide, episulfide, vinyl, hydroxyl, cyanoester, acetoxy, thiol, silanol, carboxylic acid, amino, phenolic, aldehyde, alkyl halide, cinnamate, azide, aziridine, alkene, carbamates, imide, amide, alkyne, ethylenically unsaturated groups, vinyl ether groups, and any derivatives and any combinations thereof. Alternatively, the polymer additives may be non-reactive such as poly(methyl methacrylate), poly(vinyl butyral), poly(acrylic acid), poly(vinyl alcohol), and others may be used. These polymers could also include copolymers, which is to say the polymers are made of more than one type of monomeric unit during polymerization. The copolymers could contain different architectures, such as linear, star, graft, random, or block copolymer.

Other optional additives include heat stabilizers, ultraviolet light stabilizers, free-radical scavengers, chain transfer agents, photo-sensitizers, and combinations thereof. Examples of suitable commercially available ultraviolet light stabilizers include benzophenone-type ultraviolet absorbers, which are available under the trade designation "UVINOL 400" from BASF Corp., Parsippany, NJ; and under the trade designations "TINUVIN 900," and "TINUVIN 1130" from BASF, Tarrytown, NY. Examples of suitable concentrations of ultraviolet light stabilizers in the polymerizable precursor range from about 0.1 wt. % to about 10 wt. %, with particularly suitable total concentrations ranging from about 1 wt. % to about 5 wt. %, relative to the entire weight of the polymerizable precursor.

Examples of suitable free-radical scavengers include hindered amine light stabilizer (HALS) compounds, hydroxylamines, sterically hindered phenols, and combinations thereof. Examples of suitable commercially available HALS compounds include the trade designated "TINUVIN 123", and "TINUVIN 292" from BASF. Examples of suitable concentrations of free radical scavengers in the polymerizable precursor range from about 0.05 wt. % to about 0.25 wt. % of the precursor solution.

Also disclosed herein are articles. The articles comprise a substrate with a first major surface and a second major surface; and an optically-scattering layer on first major surface of the substrate, wherein the optically-scattering layer. The optically-scattering layer scatters visible light. The optically-scattering layer is prepared by curing the curable compositions described above. The optically-scattering layers are described in greater detail below.

A wide range of substrates are suitable in the articles of this disclosure. The substrate included in the article can contain polymeric materials, glass materials, ceramic materials, metal-containing materials (e.g., metals or metal oxides), or a combination thereof. The substrate can include multiple layers of material such as a support layer, a primer layer, a hard coat layer, a decorative design, and the like. The substrate can be permanently or temporarily attached to an adhesive layer. For example, a release liner can be temporarily attached and then removed for attachment of the adhesive layer to another substrate.

The substrate can have a variety of functions such as, for example, providing flexibility, encapsulation, barrier, rigidity, strength or support, reflectivity, antireflectivity, polarization, or transmissivity (e.g., selective with respect to different wavelengths). That is, the substrate can be flexible or rigid; reflective or non-reflective; visibly clear, colored but transmissive, graphic (i.e. have a printed image or indicia), or opaque (e.g., not transmissive); and polarizing or non-polarizing.

Exemplary substrates include, but are not limited to, the outer surface of an electronic display such as liquid crystal, inorganic (LED) or organic light-emitting diode (OLED) display, the outer surface of a window or glazing, the outer surface of an optical component such as a reflector, polarizer, diffraction grating, mirror, or lens, another film such as a graphic or decorative film or another optical film, or the like.

Representative examples of polymeric substrates include those that contain polycarbonates, polyesters (e.g., polyethylene terephthalates and polyethylene naphthalates), polyurethanes, poly(meth)acrylates (e.g., polymethyl methacrylates), polyvinyl alcohols, polyolefins such as polyethylenes and polypropylenes, polyvinyl chlorides, polyimides, cellulose triacetates, acrylonitrile-butadiene-styrene copolymers, and the like.

Substrates may also include inorganic layers. The inorganic layer can be prepared from a variety of materials including metals, metal oxides, metal nitrides, metal oxynitrides, metal carbides, metal oxyborides, and combinations thereof. A wide range of metals are suitable for use in the metal oxides, metal nitrides, and metal oxynitrides, particularly suitable metals include Al, Zr, Si, Zn, Sn, and Ti. One particularly suitable inorganic barrier layer material is silicon nitride. In some embodiments, the inorganic layers provide encapsulation and barrier function to stop water and oxygen from entering into a display device.

The articles of this disclosure can be included in larger articles and devices. In some embodiments, the substrate with a light-scattering coating can be incorporated into a display device.

The articles of this disclosure include an optically-scattering layer. The optically-scattering layer is prepared by the curing of the curable compositions described above. The cured optically-scattering layer comprises a matrix with microdomains of a material that is different from the material of the matrix. The composition of the matrix and of the microdomains have been found to be more complicated than is anticipated by the PIPS (polymerization-induced phase separation) model. In the PIPS model, one would anticipate that the curable composition comprising fluoropolymer and (meth)acrylate monomers that are miscible with each other and thus is an optically clear fluid, upon curing forms microdomains of fluoropolymer within a crosslinked (meth) acrylate matrix. While this does occur upon curing, the compositions of the resulting matrix and microdomains are far more complex.

The optically-scattering layer has at least one of three different types of regions. Each of the regions comprises a matrix and phase-separated microdomains, where the matrix and phase separated microdomains have different refractive indices, and where the microdomains are on the order of or larger than the wavelengths of visible light. Typically, the wavelength of visible light is in the range of 400-700 nanometers. Generally, the average diameter of the phase separated microdomains are from 100-4,000 nanometers, or 400-2,000 nanometers, or 400-1,000 nanometers, or even 400-700 nanometers. The first type of region is a region where the essentially continuous matrix comprises a crosslinked (meth)acrylate matrix and phase separated fluorocarbon-rich microdomains. The second type of region is a region where the essentially continuous matrix comprises a crosslinked (meth)acrylate matrix and the phase separated microdomains comprise (meth)acrylate materials as well as the fluoropolymer. In these embodiments, the microdomains can still be described as fluoropolymer-rich microdomains, but they comprise nanodomains of fluoropolymer and nanodomains of crosslinked (meth)acrylate. The third type of region is a region where the essentially continuous matrix comprises a fluorocarbon-rich domain and phase separated (meth)acrylate-rich microdomains, where the (meth)acrylate-rich microdomains comprise at least cross-linked (meth)acrylate materials, and may also contain fluoropolymer. The optically-scattering layer comprises at least one of the types of regions described above. In some embodiments, the optically-scattering layer comprises only one type of region and is essentially uniform throughout. In other embodiments, the optically-scattering layer comprises more than one type of region.

In some embodiments, the optically-scattering layer comprises a cured, crosslinked (meth)acrylate matrix with fluoropolymer-rich microdomains. In some embodiments, the fluoropolymer-rich microdomains comprise essentially all fluoropolymer (regions of type 1). In other embodiments, the fluoropolymer-rich microdomains comprise (meth)acrylate materials as well as the fluoropolymer (regions of type 2). In these embodiments, the fluoropolymer-rich microdomains comprise nanodomains of fluoropolymer and nanodomains of crosslinked (meth)acrylate. In some embodiments, the optically-scattering layer may comprise regions of type 1 and regions of type 2.

In yet other embodiments, the cured optically-scattering layer comprises regions where the essentially continuous matrix is fluorocarbon-rich and the phase separated microdomains are (meth)acrylate-rich (regions of type 3). Typically, when regions of type 3 are present, regions of type 1, type 2, or a combination of type 1 and type 2 are also present. Because the fluorocarbon is present as the minor component (less than 50% by weight) of the curable composition, not enough fluorocarbon is present to form a continuous domain throughout the cured organic layer, rather regions of type 3 are present in localized areas of the cured optically-scattering layer.

As was mentioned above, the generation of three different types of regions in the cured optically-scattering layer was unexpected. The PIPS model would suggest a relatively simple process for forming a cured optically-scattering layer from a curable composition that contains fluorocarbon and (meth)acrylate materials. It was somewhat surprising that the fluorocarbon polymer and (meth)acrylate monomers are miscible because fluorocarbon polymers and (meth)acrylate polymers are generally incompatible with each other. However, because the two materials are miscible with each other prior to formation of the crosslinked poly(methacrylate) matrix, but the fluoropolymer is not miscible with the crosslinked poly(methacrylate) matrix, it was presumed that upon formation of the (meth)acrylate matrix by polymerization, fluoropolymer domains would form. It was hoped that the size of the domains could be controlled such that they were microdomains with an average diameter of 100-4,000 nanometers, or 400-2,000 nanometers, or 400-1,000 nanometers, or even 400-700 nanometers. As described above, the cured optically-scattering layer is far more complex than the PIPS model would suggest.

The cured optically-scattering layer, whether it contains only one type of region or more than one type of region, has been shown to be an optically-scattering layer. That the optically-scattering layer is able to forward scatter visible light as desired is evidenced by the fact that the cured optically-scattering layers have haze values of 5% or higher when measured as described in the Examples Section.

The complexity of the cured optically-scattering layer, namely the presence of up to three different region types within the layer, was detected with a relatively new technique that combines Atomic Force Microscopy (AFM) with Infra-red spectroscopy (IR). This new technique is abbreviated as AFM-IR. AFM-IR, a technique based on the photothermal induced resonance effect (PTIR), is a combination of atomic force microscopy (AFM) and infrared spectroscopy (IR) for nanoscale characterization. It simultaneously provides topographic and chemical information of sub-50 nm features. The AFM-IR technique uses a sharp, gold-coated AFM tip to detect the rapid thermal expansion of the sample caused by the absorption of short (10 nanosecond) pulses of IR radiation. When the monochromatic laser radiation approaches an IR frequency that excites a molecular vibration in the sample, the light is absorbed and induces a rapid thermal expansion of the sample which is in contact with the AFM tip. This results in a simultaneous deflection of the AFM tip and causes a "ring down" of the cantilever at its natural deflection resonant frequencies as the heat dissipates. These motions of the cantilever are "detected" by a second laser beam reflected off the top of the cantilever, and this signal is measured using a position-sensitive photodetector. The resonance amplitude induced in the cantilever is directly proportional to the amount of IR radiation absorbed by the sample. Thus, an AFM-IR spectrum is created by measuring the ring-down amplitudes while tuning the IR laser over the IR fingerprint region. In addition, the IR laser can be tuned to a fixed wavenumber, so that the IR absorption can be measured as a function of position as the AFM tip scans across the sample. As a result, a chemical compositional mapping is created that shows the distribution of chemical components across the sample.

Also disclosed herein are methods of preparing articles. In some embodiments, the method comprises providing a substrate with a first major surface and a second major surface, providing a curable composition, forming a layer of the curable composition on at least a portion of the first major surface of the substrate, and curing the layer of the curable composition to form a cured, crosslinked optically-scattering layer. Curable compositions have been described above and comprise at least one fluoropolymer, at least one monofunctional (meth)acrylate, at least one difunctional (meth)acrylate, and at least one initiator, where the curable composition typically has a viscosity of less than 30 centipoise at a temperature of from room temperature to 60° C. The cured, crosslinked layer comprises a (meth)acrylate matrix and fluoropolymer-rich microdomains, wherein the microdomains are on the order of or larger than the wavelengths of visible light. Generally, the microdomains are in the range of 100-4,000 nanometers, in some embodiments 400-2,000 nanometers, 400-1,000 nanometers, or even 400-700 nanometers.

The forming of the layer of the curable composition can be carried out in a wide variety of variety of coating, printing or other patterning techniques. Printing techniques are particularly suitable, as these techniques provide excellent control in the formation of layers. Examples of suitable printing techniques include screen printing, inkjet printing, flexographic printing, gravure printing, offset printing, needle dispensing, and patch coating. In some embodiments, the curable composition is coated by inkjet printing. Typically, the formed layer has a thickness of 1-76 micrometers, in some embodiments 1-51 micrometers, or even 1-25 micrometers.

The curing of the curable composition is carried out by initiating free radical polymerization by activating the initiator present in the curable composition. Typically, the initiator is a photoinitiator generally activated by UV or visible light. UV light can be supplied through a variety of different sources such as lamps. The source of the radiation used for curing could be "internal" (for example, if the coating is coated on a display, the display subpixels themselves could be used for curing) or external (a laser, a bank of UV blacklight bulbs, UV-LED lamp, etc.). If internal light sources are used, red, green or blue photosensitizers could be added to the resin along with the standard free-radical initiator. A series of red, green, or blue flashes on the display could be used to cure the ink above each subpixel, assuming non-overlapping absorbances of the visible light photosensitizers. Each flash of color could have different intensities corresponding to the cure speed necessary for each subpixel scattering layer. A blanket UV flood exposure could be used to finish the cure of the areas of the coating that are not directly over a subpixel.

If external light sources are used, a raster scanning, direct-write laser, or UV source flood exposure technique with photomasks could be used. If a laser is used for patterning, the laser could have different wavelengths or intensities as needed for the creation of the scattering layer. A laser could be used to irradiate the film at an angle to create a cone of scattering particles within the film, rather than a column of scattering particles. In a UV source flood exposure, three different photomasks could be used, with each photomask containing open windows corresponding to the location of either the red, green or blue subpixel, respectively. Perhaps the same fine metal mask that is used for the evaporation of the three different emission dyes in an OLED display could also be used as a photomask for the phase-separating ink. Then, different radiation intensities could be used for each exposure, as needed.

The curing can be carried out in selective subsections of the layer or the entire layer can be cured. In some embodiments, curing comprises pattern-wise curing of selected areas of the layer such that the layer comprises a range of microdomains. This pattern-wise curing can be carried out by selective irradiation, or through the use of masks. Selective radiation can be carried out in a wide variety of ways. For example, irradiation with different intensities at different spots can give the variable irradiation, or irradiation of a selective area with an irradiation source can be carried out in selective areas with a laser or similar light source, followed by curing of the remainder of the surface area with a conventional light source. One layer of curable composition formulation could be used over the entire area of the device as a single film, or three different inkjet print heads could deposit three different ink formulations over each R, G and B subpixel, for example. Each of the three formulations could be tuned to correct the deficiencies of each emission wavelength.

After deposition of the curable composition, a first (low) radiation intensity could be used to form the scattering domains and lock them into a crosslinked matrix. A second radiation pulse (of a much higher intensity) could be used to finish the cure the remaining acrylate monomer. Likely the higher intensity would also lead to phase-separated fluoropolymer domains, but these domains would be so small they could be considered optically insignificant. Other uses for such a multi-modal or gradient distribution of domain sizes may also be considered, such as for some degree of light steering or optical focusing.

Upon initiation of the polymerization, the optically-scattering layer is formed. As mentioned above, three different types of regions can form in the layer. The optically-scattering layer includes a matrix and phase separated microdomains. The microdomains may be fluoropolymer-rich or (meth)acrylate-rich. Without being bound by theory, since the formation of the microdomains are thought to be diffusion-limited, the speed at which the crosslinked poly (meth)acrylate matrix forms may directly affect the size of the microdomains. Since the cure speed of the poly(meth) acrylate matrix can be directly affected by changing the intensity of the curing radiation, we anticipate the ability to pattern distinct levels of scattering using different intensities of light. For example, a low light intensity can be used to create large fluoropolymer or acrylate micro-domains in one area of the layer, and a high light intensity can be used to create small fluoropolymer or (meth)acrylate microdomains in another area of the layer. The different domain sizes will lead to changes in the haze and optical scattering in each of the areas of the layer. According to Mie theory, the intensity of scattered light is proportional to the square of the difference of the refractive index between the two phases and the sixth power of the radius of the dispersed phase, assuming particles smaller than the wavelength of light. Other ways to affect the cure speed include changing the functionality, viscosity, and molecular weight of the (meth)acrylate monomers used in the resin mixture. In this way, when the curing is carried out selectively, i.e. the radiation exposure of different regions of the curable composition layer is different, the formation of microdomains are likewise different. In other words, selective curing can produce a light diffusing layer with different microdomains at different points on the layer. Such selectivity is not possible with particle-based light diffusing layers or with the light diffusing layers described in U.S. Pat. No. 9,238,762 (Schaffer et al.), as these light diffusing layers are the same at all points of the layer.

The methods of this disclosure can be further understood by the FIGS. 1A-1I. FIGS. 1A-1I illustrate a wide range of methods of curing that can be utilized to produce the optically-scattering layers of the present disclosure. It should be noted that the figures are meant to be illustrative and are not to scale.

FIG. 1A shows a curable layer comprising substrate layer 10A with curable composition 20A disposed on it. The curable composition is exposed to actinic radiation 30A. The actinic radiation is typically UV light and it causes the curable composition 20A to cure to form cured matrix 50A with phase separated microdomains 40A.

FIG. 1B shows a curable layer comprising substrate layer 10B with curable composition 20B disposed on it. The curable composition is exposed to actinic radiation of differing intensities (shown as $I_1$, $I_2$, and $I_3$) 31B, 32B, and 33B. The actinic radiation 31B has intensity $I_1$, the actinic radiation 32B has intensity 12, and the actinic radiation 33B has the intensity 13 where the relative intensities of the actinic radiation are: $I_1 < I_2 < I_3$. The actinic radiation is typically UV light and it causes the curable composition 20B to cure to form cured matrix 50B with phase separated microdomains 41B, 42B, and 43B. The sizes of phase separated microdomains 41B, 42B, and 43B are shown to be different. While the phase separated microdomains 41B, 42B, and 43B are different, it should be noted that the sizes are representative and not to scale.

FIG. 1C shows a curable layer comprising substrate layer 10C with curable composition 20C disposed on it. The curable composition is exposed to actinic radiation of differing intensities 31C, 32C, and 33C. The actinic radiation 31C has an intensity that is lower than the intensity of actinic radiation 32C, and the actinic radiation 33C has the intensity that is lower than the intensity of actinic radiation 32C, and may be the same as the intensity of actinic radiation 31C, or it may be different. The actinic radiation is typically UV light and it causes the curable composition 20C to cure to form cured matrix 50C with phase separated microdomains 41C, 42C, and 43C. The sizes of phase separated microdomains 41C, 42C, and 43C are shown to be different. While the phase separated microdomains 41C, 42C, and 43C are different, it should be noted that the sizes are representative and not to scale.

FIG. 1D shows a curable layer comprising substrate layer 10D with curable composition layer that comprises curable composition sublayers 21D, 22D, and 23D disposed on it. In this embodiment, the curable composition sublayers may represent, for example, curable compositions of different viscosities. Three sublayers are shown for clarity but it should be understood that a wide range of sublayers are possible. The sublayers could be created by a gradient of light intensity received throughout the bulk of the film. For example, films that contain molecules that absorb ultraviolet radiation, such as ultraviolet absorbers, may receive a higher light intensity on the top of the film compared to the bottom of the film. The curable composition is exposed to actinic radiation 30D. The actinic radiation is typically UV light and it causes the curable composition sublayers 21D, 22D, and 23D to cure to form cured matrix 50D with phase separated microdomains 41D, 42D, and 43D. The sizes of phase separated microdomains 41D, 42D, and 43D are shown to be different. While the phase separated microdomains 41D, 42D, and 43D are different, it should be noted that the sizes are representative and not to scale.

Figure 1E:
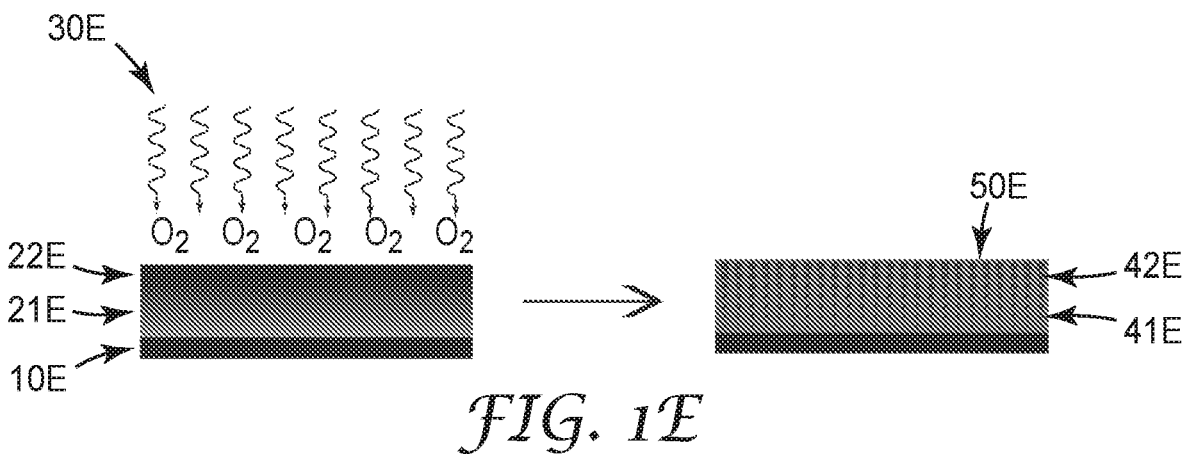
FIG. 1E shows a schematic of another process of this disclosure for forming an optical light scattering article.

FIG. 1E shows a curable layer comprising substrate layer 10E with curable composition layer that comprises curable composition sublayers 21E, and 22E disposed on it. In this embodiment, the curable composition sublayers are different because the surface sublayer 22E is exposed to an oxygen atmosphere because the curable article is not present in an inert atmosphere, such as nitrogen. The curable composition is exposed to actinic radiation 30E. The actinic radiation is typically UV light and it causes the curable composition sublayers 21E, and 22E to cure to form cured matrix 50E with phase separated microdomains 41E, and 42E. The presence of oxygen in surface sublayer 22E is expected to hinder the polymerization rate in this sublayer. The sizes of phase separated microdomains 41E, and 42E are shown to be different. While the phase separated microdomains 41E, and 42E are different, it should be noted that the sizes are representative and not to scale.

Figure 1F:
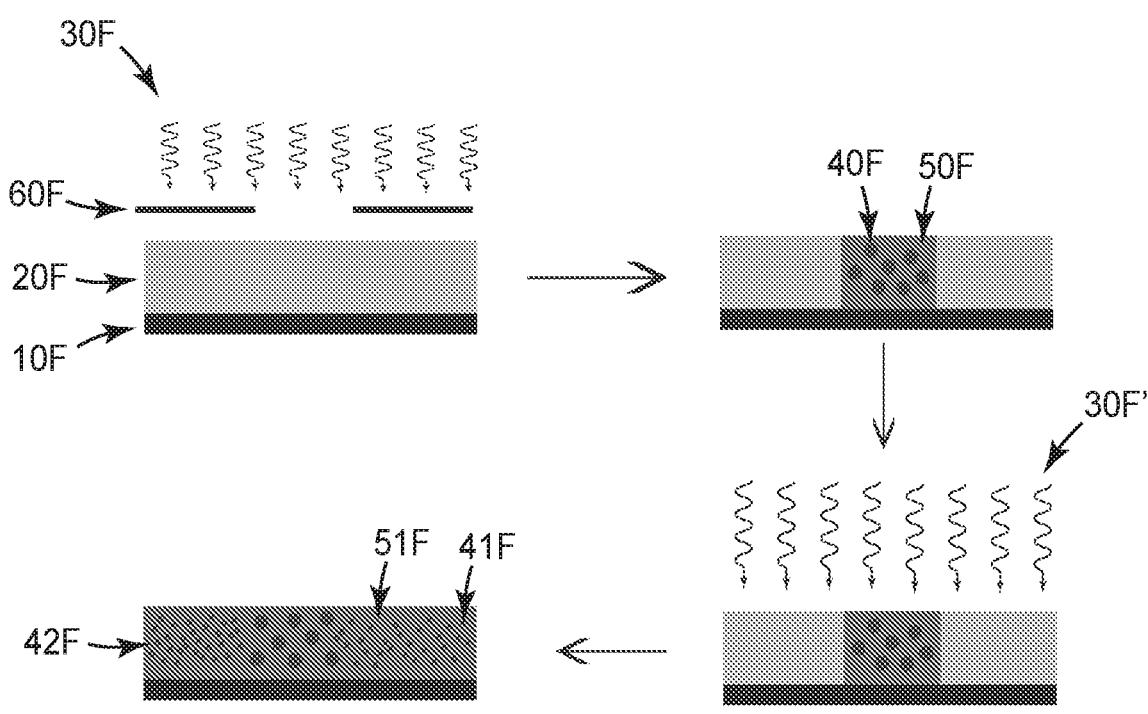
FIG. 1F shows a schematic of another process of this disclosure for forming an optical light scattering article.

FIG. 1F shows a curable layer comprising substrate layer 10F with curable composition 20F disposed on it. A portion of the curable composition 20F is blocked by mask 60F. The curable composition is exposed to actinic radiation 30F. Because of the mask 60F, only a portion of the curable composition 20F receives actinic radiation 30F. The actinic radiation is typically UV light and it causes the curable composition 20F to cure to form cured matrix 50F with phase separated microdomains 40F in area where radiation 30F was received. Mask 60F is removed and the composition is exposed to actinic radiation 30F'. Actinic radiation 30F' may be the same as or different from actinic radiation 30F. The actinic radiation is typically UV light and it causes the uncured curable composition to cure to form cured matrix 51F with phase separated microdomains 41F and 42F in areas where radiation 30F' was received.

Figure 1G:
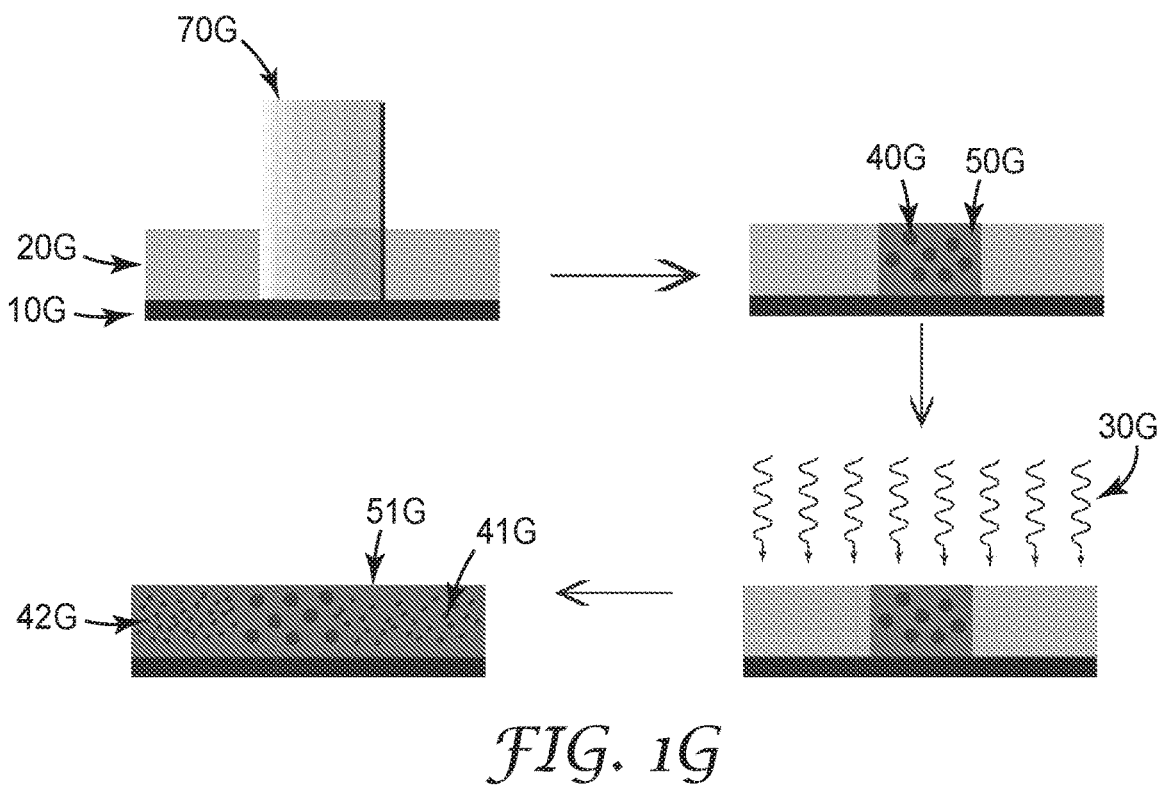
FIG. 1G shows a schematic of another process of this disclosure for forming an optical light scattering article.

FIG. 1G shows a curable layer comprising substrate layer 10G with curable composition 20G disposed on it. A portion of the curable composition 20G is exposed to actinic radiation 70G. Actinic radiation 70G can be, for example, a laser. Because of the narrowness of the light source 70G, only a portion of the curable composition 20G receives actinic radiation. The actinic radiation causes the curable composition 20G to cure to form cured matrix 50G with phase separated microdomains 40G in area where radiation 70G was received. The composition is exposed to actinic radiation 30G. Actinic radiation 30G is typically a flood exposure of UV light and it causes the uncured curable composition to cure to form cured matrix 51G with phase separated microdomains 41G and 42G in areas where radiation 30G was received.

Figure 1H:
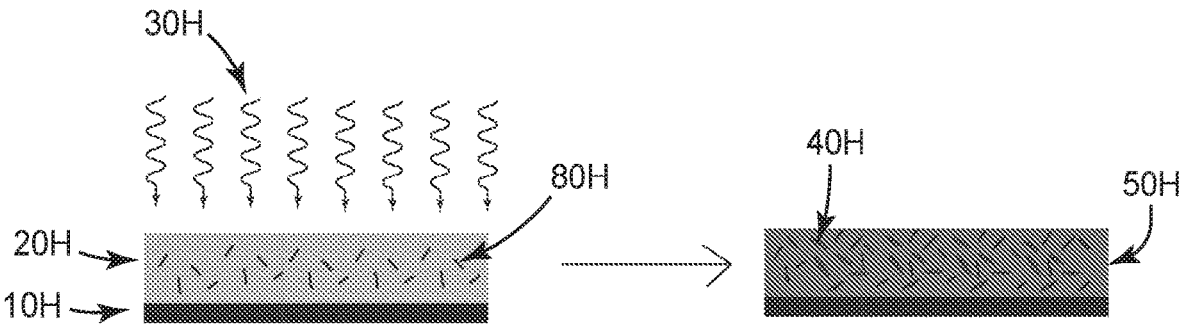
FIG. 1H shows a schematic of another process of this disclosure for forming an optical light scattering article.

FIG. 1H shows a curable layer comprising substrate layer 10H with curable composition 20H disposed on it. The curable composition 20H contains nanoparticles 80H. The curable composition 20H is exposed to actinic radiation 30H. The actinic radiation is typically UV light and it causes the curable composition 20H to cure to form cured matrix 50H with phase separated microdomains 40H. The surface of said nanoparticles may be engineered to act as a seed to nucleate phase separation, or they may be used for other functions, such as modifying refractive index.

Figure 1I:
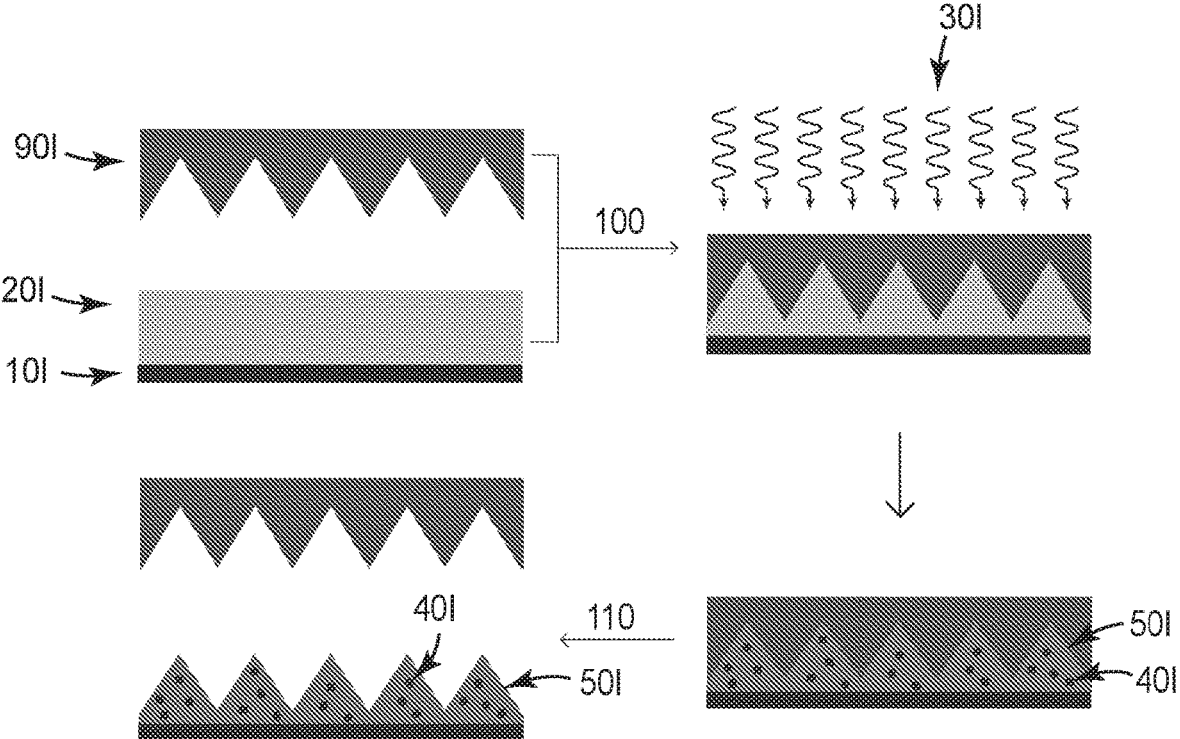
FIG. 1I shows a schematic of another process of this disclosure for forming an optical light scattering article.

FIG. 1I shows a curable layer comprising substrate layer 10I with curable composition 20I disposed on it. Tool film 90I has a microstructured pattern in one surface. In step 100, tool film 90I is contacted to the curable composition 20I to form a laminate construction. The curable composition is exposed to actinic radiation 30I. The actinic radiation is typically UV light and it causes the curable composition 20I to cure to form cured matrix 50I with phase separated microdomains 40I. The tool film 90I is then removed in step 110 to generate a structured, cured layer with cured matrix 50I and phase separated microdomains 40I.

Organic light emitting diode (OLED) displays can produce a light output having a color that varies with view direction. This effect can be particularly objectionable in strong cavity OLEDs where a cavity between the cathode and anode of the emissive stack of the OLED has an output that depends on wavelength and view angle approximately as the cosine of the view angle in the cavity divided by the wavelength. An OLED display often includes an array of pixels, and each pixel includes multiple subpixels. Typically, each OLED subpixel emits red, blue or green light. In some cases, subpixels may be used which emit white, cyan, magenta, yellow or other colors of light. OLED subpixels include at least one, and oftentimes several, layers of organic material sandwiched between a cathode and an anode. The design of an OLED subpixel includes selecting the thickness, and optical and electronic properties of each layer so that the emitted light has the desired output. The OLED layer architecture is sometimes referred to as the "emissive stack" or OLED "stack."

In some embodiments, an OLED display includes an encapsulant which may include one or more layers disposed adjacent or proximate the emissive stack. Often, the encapsulation layers include at least two inorganic layers; these layers often contain Silicon Nitride, Silicon Oxynitride, Alumina, Silicon-alumina oxide, though other materials may also be used. Optionally, the emissive stack may contain one or more layers which are disposed between the cathode and the encapsulant. A circular polarizer may be disposed adjacent the encapsulant. The color shift and efficiency of the OLED display depends on design parameters of the OLED display. For example, both the color shift and the efficiency depend on the thickness and materials of layers of the OLED display. In conventional OLED displays, the OLED layers are chosen to achieve a desired compromise between color shift and efficiency.

Figure 2:
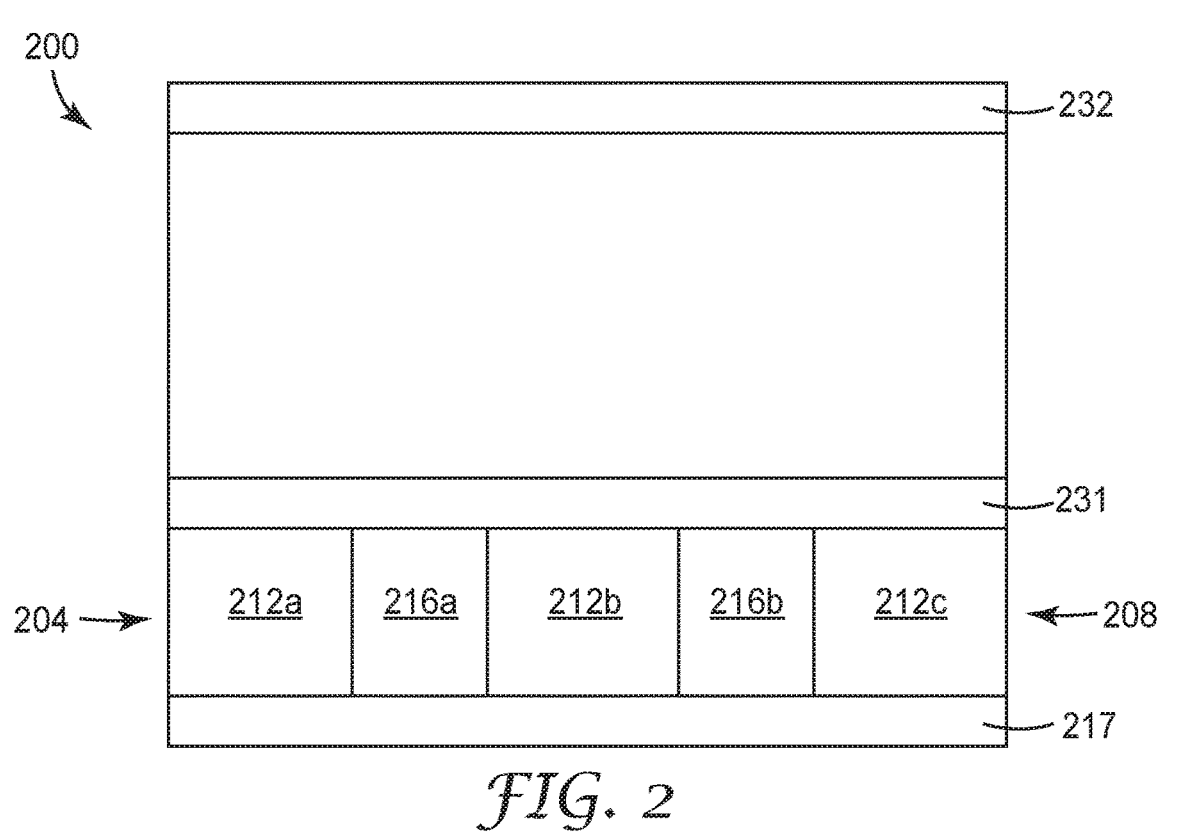
FIG. 2 shows a schematic cross-sectional view of an information display system according to exemplary embodiments of the present disclosure.

FIG. 2 illustrates an information display system 200 including a pixelated display 204. The pixelated display 204 can be an Organic Light Emitting Diode (OLED) display, a micro-LED display or any other emissive display. The pixelated display 204 can include a plurality of pixels 208, and each pixel 208 can include one or more subpixels 212a, 212b, 212c that each emit light. Each of subpixels 212a, 212b, 212c can emit any of blue, green, red, white or any other color based on desired design characteristics. In some embodiments, 212a can emit red light, 212b can emit green light and 212c can emit blue light. An inter-pixel region 216a, 216b can exist between any two of the subpixels 212a, 212b, 212c in the pixelated display 204. Each inter-pixel region 216a, 216b can be an area of the pixelated display 204 that does not emit light.

Figure 3:
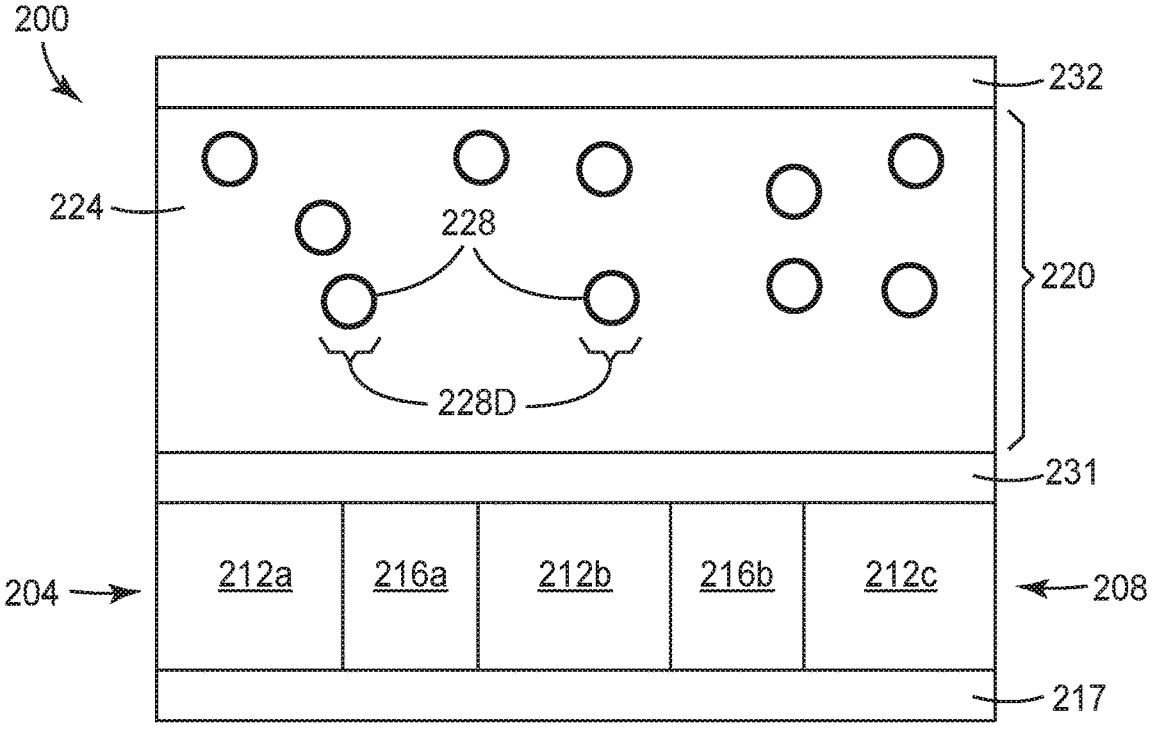
FIG. 3 shows a schematic cross-sectional view of an information display system, including a plurality of phase-separated microdomains, according to exemplary embodiments of the present disclosure.

Turning to FIG. 3, a reflective anode 217 and an optically-scattering layer 220 can be disposed on substantially opposed sides of the subpixels 212a, 212b, 212c and inter-pixel regions 216a, 216b. The optically-scattering layer 220 can be in optical communication with the pixelated display 204. The optically-scattering layer 220 can include a matrix 224 which can further be disposed within thin film encapsulation layers 231, 232. The matrix 224 can be the matrix as described throughout this specification, in various embodiments, and the encapsulation layers 231, 232 can be the encapsulation layers as described throughout this specification, in various embodiments.

As shown in FIG. 3, among other figures, the information display system 200 can include phase-separated microdomains 228, which can be the phase-separated microdomains as described throughout this specification, in various embodiments. The phase-separated microdomains 228 can be disposed within the matrix 224 as illustrated in FIG. 3, and the phase-separated microdomains 228 and the matrix 224 can have different refractive indices. In various embodiments, the difference between the refractive indices of the phase-separated microdomains 228 and of the matrix 224 can be, can be about, can be at least or can be at most 50%, 40%, 30%, 25%, 20%, 15%, 10%, 9%, 8%, 7%, 6%, 5%, 4%, 3%, 2% or 1% of the lower refractive index.

The phase-separated microdomains 228 in FIG. 3 can each define a diameter 228D and the diameters 228D can define an average diameter AD3. It is to be understood that the diameter 228D can be used to indicate a distance across a phase-separated microdomain 228 having any shape, a distance across a phase-separated microdomain 228 as measured along the shortest distance between exterior points of the phase-separated microdomain 228 and/or an average of all possible distances across the phase-separated microdomain 228.

Figure 4:
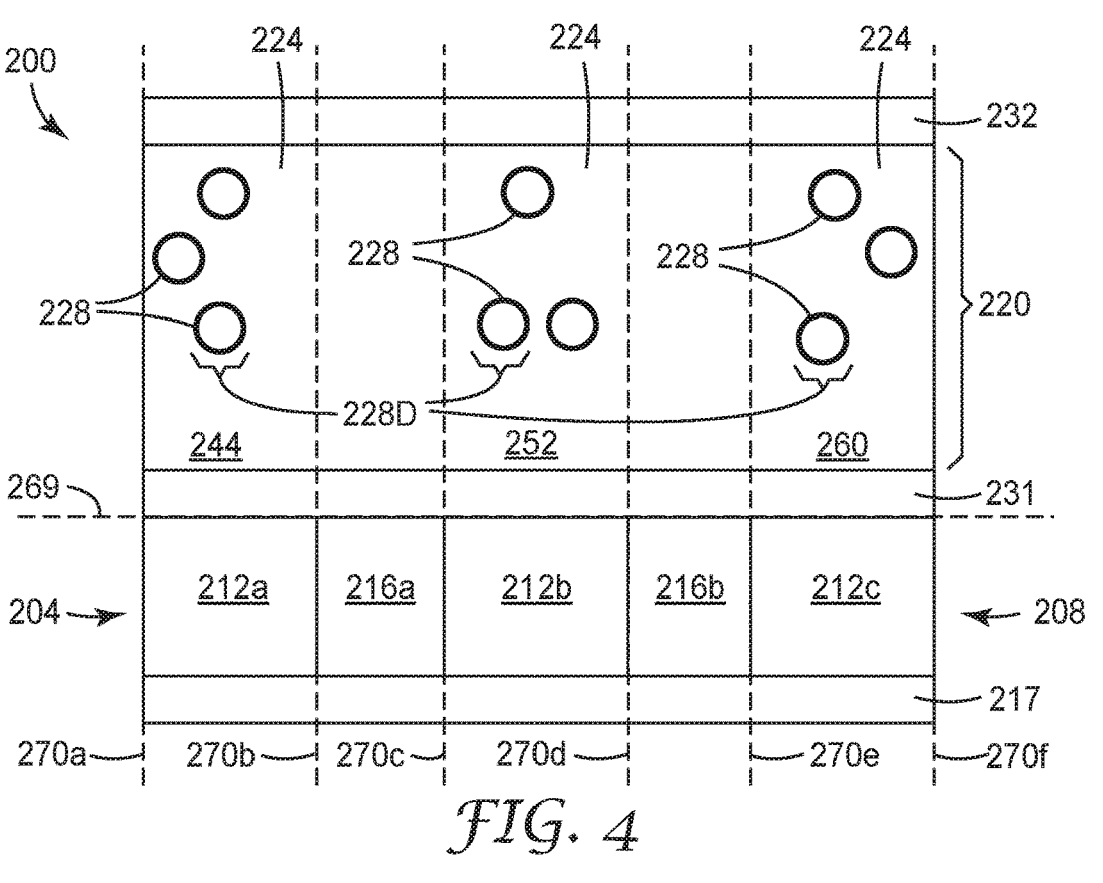
FIG. 4 shows a schematic cross-sectional view of an information display system, including a plurality of phase-separated microdomains and a plurality of subpixel zones, according to exemplary embodiments of the present disclosure.

Turning to FIG. 4, a plurality of subpixel zones 244, 252, 260 are shown. Also shown are an OLED surface layer 269 and a plurality of boundary lines 270a, 270b, 270c, 270d, 270e, 270f. The boundary lines 270a-f can extend from the pixelated display 204 at an angle normal to the OLED surface layer 269 and/or to the pixelated display 204. The boundary lines 270a-f can pass between subpixels 212a-c and inter-pixel regions 216a, 216b, can pass adjacent one or more of subpixels 212a-c and inter-pixel regions 216a, 216b and/or do not pass through a subpixels 212a-c or and inter-pixel region 216a, 216b.

In some embodiments, the subpixel zones 244, 252, 260 are bounded by two sequential boundary lines from among 270a-f. In some embodiments, the subpixel zones 244, 252, 260 are bounded by two sequential boundary lines from among 270a-f and one or more of the OLED surface layer 269, the pixelated display 204, the thin film encapsulation layer 231 and the thin film encapsulation layer 232. In some embodiments, the subpixel zones 244, 252, 260 are bounded by two sequential boundary lines from among 270a-f, the thin film encapsulation layer 231 and the thin film encapsulation layer 232. In some embodiments, the subpixel zones 244, 252, 260 are bounded by two sequential boundary lines from among 270a-f within the matrix 224.

In FIG. 4, it can be seen that each phase-separated microdomain 228 in all subpixel zones 244, 252, 260 defines a substantially equal diameter 228D, and the average diameter of the phase-separated microdomains 228 in each subpixel zone 244, 252, 260 of FIG. 4 is AD4. Further, it can be seen that there are a substantially equal number of phase-separated microdomains 228 in each subpixel zone 244, 252, 260. In various embodiments throughout this specification, a substantially equal diameter indicates diameters being within, being at least or being at most 50%, 40%, 30%, 25%, 20%, 15%, 10%, 9%, 8%, 7%, 6%, 5%, 4%, 3%, 2% or 1% of the lower of the two diameters. In various embodiments throughout this specification, a substantially equal number indicates numbers being within, being at least or being at most 50%, 40%, 30%, 25%, 20%, 15%, 10%, 9%, 8%, 7%, 6%, 5%, 4%, 3%, 2% or 1% of the lower of the two numbers.

Figure 5:
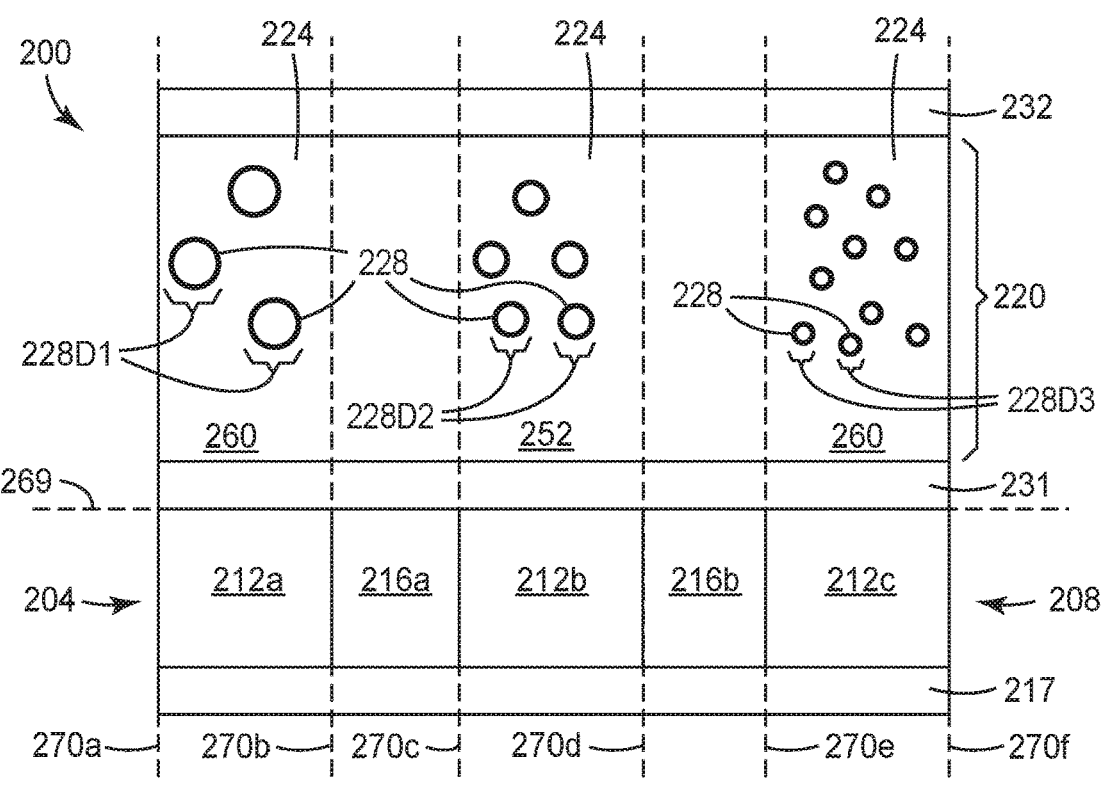
FIG. 5 shows a schematic cross-sectional view of an information display system, including a plurality of phase-separated microdomains and a plurality of subpixel zones, according to exemplary embodiments of the present disclosure.

Turning to FIG. 5, it can be seen that each phase-separated microdomain 228 in one subpixel zone from among subpixel zones 244, 252, 260 defines a substantially equal diameter (228D1, 228D2, 228D3, respectively), but that phase-separated microdomains 228 in different subpixel zones 244, 252, 260 define substantially different diameters than do phase-separated microdomains 228 in other subpixel zones 244, 252, 260. In various embodiments throughout this specification, substantially different diameters indicates that the difference in the diameters is at least, at most or about 50%, 40%, 30%, 25%, 20%, 15%, 10%, 9%, 8%, 7%, 6%, 5%, 4%, 3%, 2% or 1% of the lower diameter. In other words, phase-separated microdomains 228 in subpixel zone 244 all define a substantially equal diameter (228D1), which is a substantially different diameter than that defined by phase-separated microdomains 228 in subpixel zones 252 (228D2) and 260 (228D3), and phase-separated microdomains 228 in subpixel zone 252 define a substantially different diameter (228D2) than do phase-separated microdomains 228 in subpixel zone 260 (228D3). It is to be understood that any permutation of different diameters of phase-separated microdomains 228 in different subpixel zones is within the scope of this disclosure.

In some embodiments, the phase-separated microdomains 228 in one subpixel zone from among subpixel zones 244, 252, 260 define an average diameter (AD1, AD2, AD3, respectively), but phase-separated microdomains 228 in different subpixel zones 244, 252, 260 define substantially different average diameters than do phase-separated microdomains 228 in other subpixel zones 244, 252, 260. In various embodiments throughout this specification, substantially different average diameters indicates a difference between the average diameters being at least 50%, 40%, 30%, 25%, 20%, 15%, 10%, 9%, 8%, 7%, 6%, 5%, 4%, 3%, 2% or 1% of the lower average diameter. In other words, phase-separated microdomains 228 in subpixel zone 244 define an average diameter (AD1), which is a substantially different average diameter than that defined by phase-separated microdomains 228 in subpixel zones 252 (AD2) and 260 (AD3), and phase-separated microdomains 228 in subpixel zone 252 define a substantially different average diameter (AD2) than do phase-separated microdomains 228 in subpixel zone 260 (AD3). It is to be understood that any permutation of different average diameters of phase-separated microdomains 228 in different subpixel zones is within the scope of this disclosure.

Also in FIG. 5, it can be seen that a number of phase-separated microdomains 228 are in each subpixel zone 244, 252, 260. The number of phase-separated microdomains 228 in subpixel zone 244 is different than the number of phase-separated microdomains 228 in subpixel zone 252 and different than the number of phase-separated microdomains 228 in subpixel zone 260. Further, the number of phase-separated microdomains 228 in subpixel zone 252 is different than the number of phase-separated microdomains 228 in subpixel zone 260. It is to be understood that any permutation of different numbers of phase-separated microdomains 228 in different subpixel zones is within the scope of this disclosure.

Figure 6:
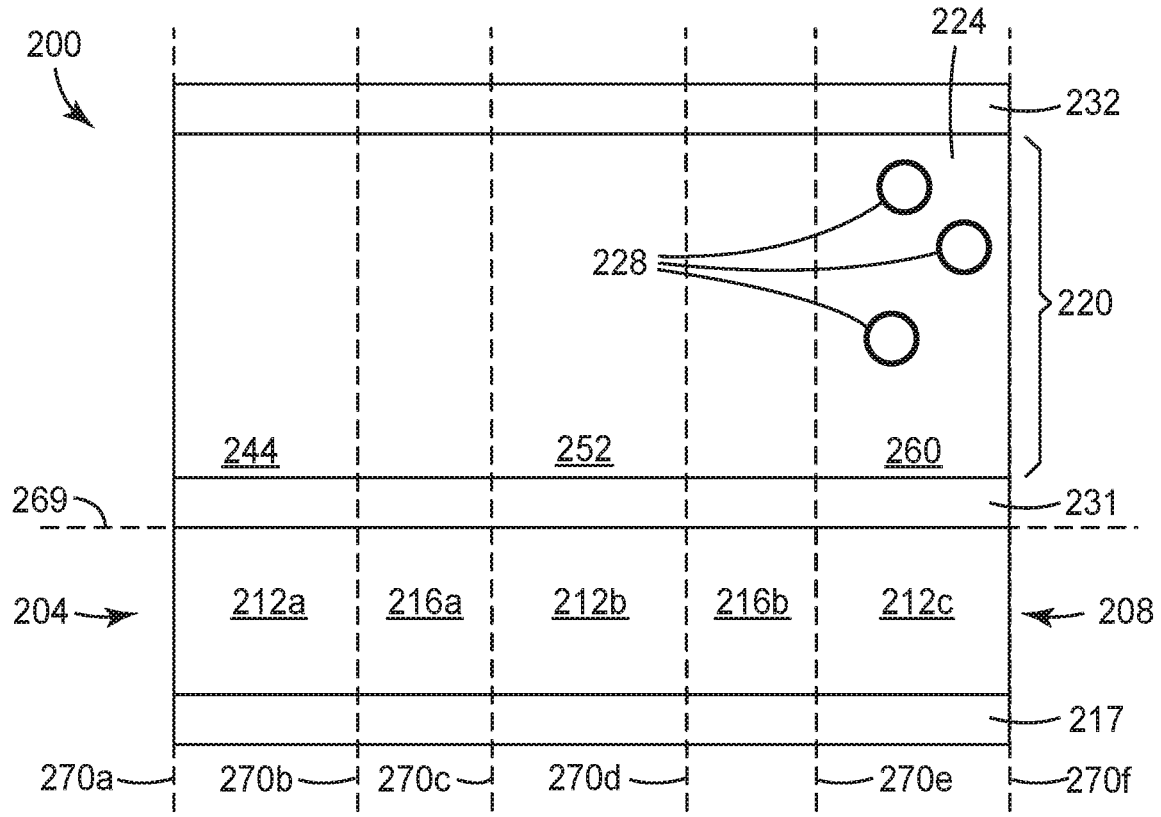
FIG. 6 shows a schematic cross-sectional view of an information display system, including a plurality of phase-separated microdomains in a subpixel zone, according to exemplary embodiments of the present disclosure.

Turning to FIG. 6, it can be seen that phase-separated microdomains 228 are disposed in subpixel zone 260, while subpixel zones 244 and 252 are devoid of phase-separated microdomains 228. It is to be understood that any permutation of subpixel zones 244, 252, 260 that include phase-separated microdomains 228 with any other permutation of subpixel zones 244, 252, 260 that are devoid of phase-separated microdomains 228 is within the scope of this disclosure.

Figure 7:
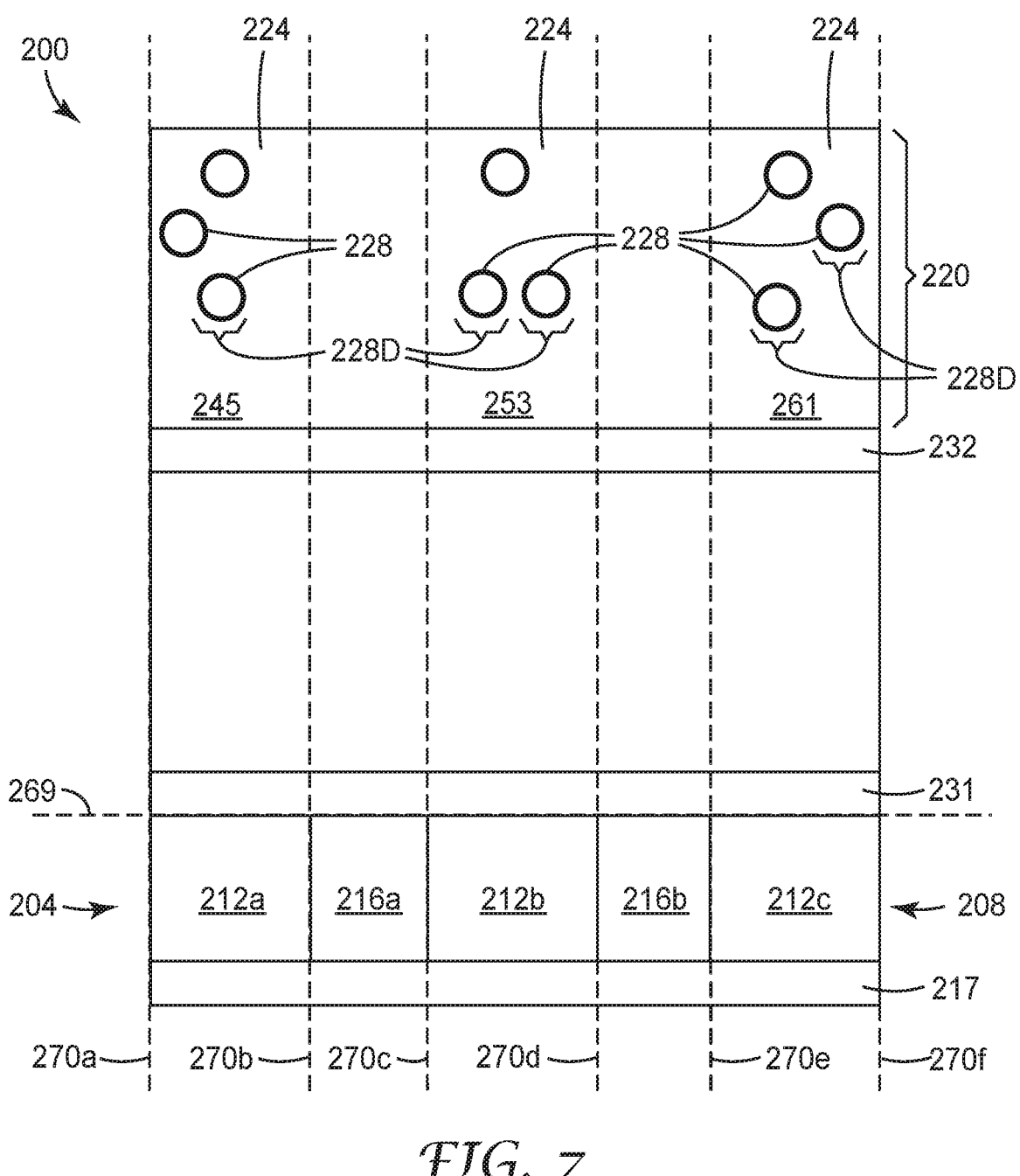
FIG. 7 shows a schematic cross-sectional view of an information display system, including a plurality of phase-separated microdomains and a plurality of subpixel zones, according to exemplary embodiments of the present disclosure.
Figure 8:
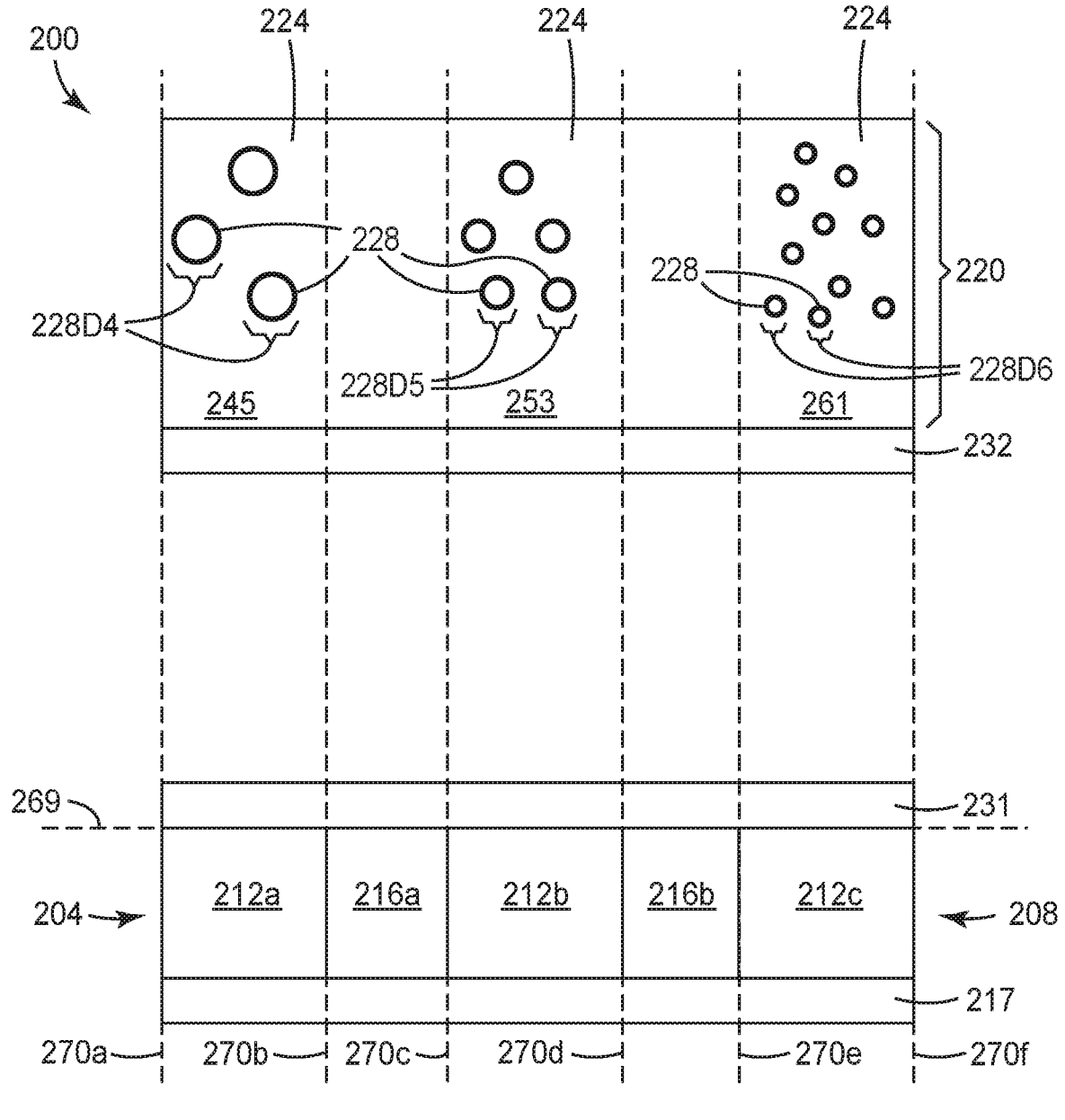
FIG. 8 shows a schematic cross-sectional view of an information display system, including a plurality of phase-separated microdomains and a plurality of subpixel zones, according to exemplary embodiments of the present disclosure.
Figure 9:
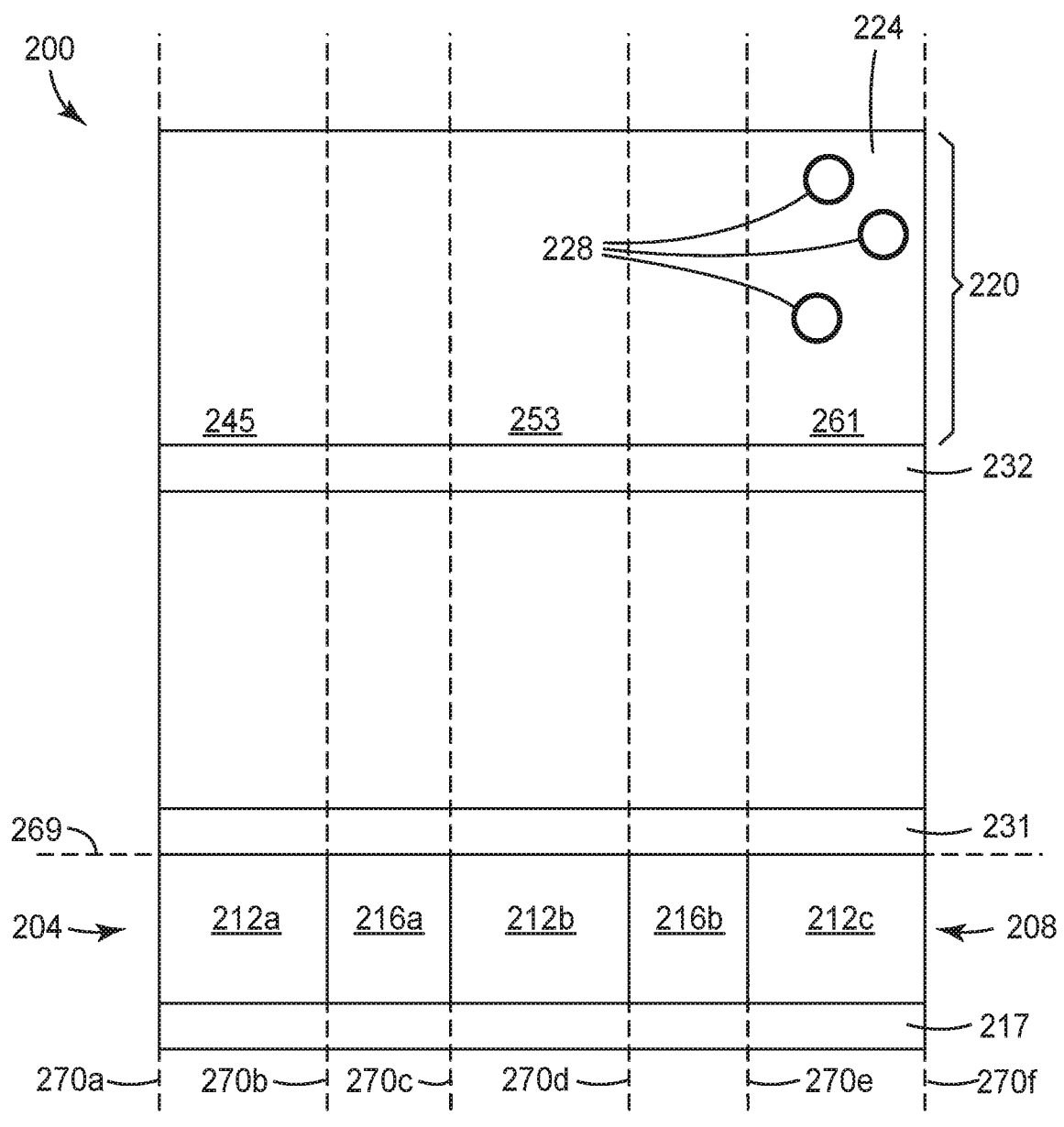
FIG. 9 shows a schematic cross-sectional view of an information display system, including a plurality of phase-separated microdomains in a subpixel zone, according to exemplary embodiments of the present disclosure.

FIGS. 7-9 illustrate embodiments including an optically-scattering layer 220 disposed on an opposed side of the thin film encapsulation layers 231, 232 from the subpixels 212a-

*c.* Similar to FIG. 4, FIG. 7 illustrates a plurality of subpixel zones 245, 253, 261. Also shown are the OLED surface layer 269 and the plurality of boundary lines 270*a*, 270*b*, 270*c*, 270*d*, 270*e*, 270*f*.

In some embodiments, the subpixel zones 245, 253, 261 are bounded by two sequential boundary lines from among 270*a-f*. In some embodiments, the subpixel zones 244, 252, 260 are bounded by two sequential boundary lines from among 270*a-f* and the thin film encapsulation layer 232. In some embodiments, the subpixel zones 245, 253, 261 are bounded by two sequential boundary lines from among 270*a-f* within the matrix 224.

In FIG. 7, it can be seen that each phase-separated microdomain 228 in all subpixel zones 245, 253, 261 defines a substantially equal diameter 228D, and the average diameter of the phase-separated microdomain 228 in each subpixel zone 245, 253, 261 is AD in the embodiment shown in FIG. 7. Further, it can be seen that there is a substantially equal number of phase-separated microdomains 228 in each subpixel zone 245, 253, 261.

Turning to FIG. 8, it can be seen that each phase-separated microdomain 228 in one subpixel zone from among subpixel zones 245, 253, 261 defines a substantially equal diameter (228D4, 228D5, 228D6, respectively), but that phase-separated microdomains 228 in different subpixel zones 245, 253, 261 define substantially different diameters than do phase-separated microdomains 228 in other subpixel zones 245, 253, 261. In other words, phase-separated microdomains 228 in subpixel zone 245 all define a substantially equal diameter (228D4), which is a substantially different diameter than that defined by phase-separated microdomains 228 in subpixel zones 253 (228D5) and 261 (228D6), and phase-separated microdomains 228 in subpixel zone 253 define a substantially different diameter (228D5) than do phase-separated microdomains 228 in subpixel zone 261 (228D6). It is to be understood that any permutation of different diameters of phase-separated microdomains 228 in different subpixel zones is within the scope of this disclosure.

In some embodiments, the phase-separated microdomains 228 in one subpixel zone from among subpixel zones 245, 253, 261 define an average diameter (AD4, AD5, AD6, respectively), but phase-separated microdomains 228 in different subpixel zones 245, 253, 261 define substantially different average diameters than do phase-separated microdomains 228 in other subpixel zones 245, 253, 261. In other words, phase-separated microdomains 228 in subpixel zone 245 define an average diameter (AD4), which is a substantially different average diameter than that defined by phase-separated microdomains 228 in subpixel zones 253 (AD5) and 261 (AD6), and phase-separated microdomains 228 in subpixel zone 253 define a substantially different average diameter (AD5) than do phase-separated microdomains 228 in subpixel zone 261 (AD6). It is to be understood that any permutation of different average diameters of phase-separated microdomains 228 in different subpixel zones is within the scope of this disclosure.

Also in FIG. 8, it can be seen that a number of phase-separated microdomains 228 are in each subpixel zone 245, 253, 261. The number of phase-separated microdomains 228 in subpixel zone 245 is different than the number of phase-separated microdomains 228 in subpixel zone 253 and different than the number of phase-separated microdomains 228 in subpixel zone 261. Further, the number of phase-separated microdomains 228 in subpixel zone 253 is different than the number of phase-separated microdomains 228 in subpixel zone 261. It is to be understood that any permutation of different numbers of phase-separated microdomains 228 in different subpixel zones is within the scope of this disclosure.

Turning to FIG. 9, it can be seen that phase-separated microdomains 228 are disposed in subpixel zone 261, while subpixel zones 245 and 253 are devoid of phase-separated microdomains 228. It is to be understood that any permutation of subpixel zones 245, 253, 261 that include phase-separated microdomains 228 with any other permutation of subpixel zones 245, 253, 261 that are devoid of phase-separated microdomains 228 are within the scope of this disclosure.

These disclosed arrangements and embodiments can be beneficial for improved display qualities such as angular color uniformity and angular brightness profiles when used with an emissive display. The disclosed embodiments can enhance display quality by scattering emitted light from subpixels in the information display while minimizing the overall volume and/or number of phase-separated microdomains in the optically-scattering layer.

Examples

Curable ink compositions were prepared. The materials were applied to substrates and the physical, optical and mechanical properties were evaluated as shown in the following examples. These examples are merely for illustrative purposes only and are not meant to be limiting on the scope of the appended claims. All parts, percentages, ratios, etc. in the examples and the rest of the specification are by weight, unless noted otherwise.

Solvents and other reagents used were obtained from Sigma-Aldrich Chemical Company, St. Louis, Missouri unless otherwise noted. The following abbreviations are used herein: nm=nanometer; mm=millimeters; cm=centimeters; um=micrometer; m=meter; N=Newton; mW=milliwatt; min=minutes; K=1,000 (ie 15 KDa=15,000 Daltons molecular weight); Hz=Hertz; cPs=centipoise; mol=mole; ° C.=degree centigrade; T=Transmission; H=Haze; C=Clarity, avg=average and stdev=standard deviation. The terms wt %, and % by weight are used interchangeably.

TABLE 1

| Table of Materials | |
|---|---|
| Component Abbreviation | Description |
| M1 | Tetrahydrofurfuryl methacrylate, available as "SR203" from Sartomer, Exton, PA |
| M2 | 1,6-hexanediol dimethacrylate, available as "SR239" from Sartomer, Exton, PA |
| M3 | Tetrahydrofurfuryl acrylate, available as "SR285" from Sartomer, Exton, PA |
| M4 | 1,6-hexanediol diacrylate, available as "SR238" from Sartomer, Exton, PA |
| M5 | n-vinyl pyrrolidone, "NVP" available from Sigma Aldrich |
| PH1 | 2,4,6-Trimethylbenzoylphenylphosphinic acid ethyl ester, available as "Omnirad TPO-L" from IGM Resins (Charlotte, NC) |
| B1 | Spacer Beads ("MBX-30" Sekisui Plastics Co., Ltd (Tokyo, Japan) cross-linked poly(methylmethacrylate) spherical particle of 30 micrometer average particle diameter |
| P1 | FC 2145 Fluoroelastomer, from 3M Company, St. Paul, MN, copolymer of vinylidene fluoride (78.3 mole %) and hexafluoropropylene (21.7 mole %) (65.9% Fluorine content, Mn ~100 kDa) |
| P2 | FC 2178 Fluoroelastomer from 3M Company, St. Paul, MN, copolymer of vinylidene fluoride (78.3 mole %) and |

TABLE 1-continued

Table of Materials

| Component Abbreviation | Description |
|---|---|
| | hexafluoropropylene (21.7 mole %) (65.9% Fluorine content, Mn ~180 kDa) |
| P3 | FC 2211 from 3M Company, St. Paul, MN, copolymer of vinylidene fluoride (78.3 mole %) and hexafluoropropylene (21.7 mole %) (65.9% Fluorine content, Mn ~80 kDa) |
| S1 | PET film, available as "MELINEX 542" 4 mil (101.6 micrometer) from TEKRA Inc., New Berlin, WI |
| IG1 | Photomask (available from Infinite Graphics, Minneapolis, MN) |

Test Methods

Sample Preparation

Coatings for the optical tests were made on substrate S1 using a wire-wound rod (Model: RDS10, RDS Specialties, Webster, NY). Ultraviolet (UV) curing of the films was performed immediately after coating using a CA-3200 UV-LED curing chamber with an integrated N2 purge ($\lambda$=365-400 nm, Clearstone Technologies Inc., Hopkins, MN).

The samples were prepared by sandwiching the resin in between two pieces of primed PET (S1) substrate. The S1/Resin/S1 stack was then placed on top of a photomask patterned with varying thicknesses of chrome (IG1) to achieve several discrete levels of intensity across the sample as the UV irradiation passes through the mask. Another piece of bare glass was placed over the top of the S1/Resin/S1 stack and then the entire construction was clamped to close contact with binder clips. A piece of thick black plastic was placed on top of the clamped construction to prevent back reflection of the UV from the top of the curing chamber during the cure. The cure through the photomask was performed for 30 minutes, followed by a 15 minute flood exposure without the photomask with a UV intensity of 95.6 mW/cm$^2$. The intensity of light passing through each one of the areas of the photomask was measured with a radiometer (UV PowerPuck II, Electronic Instrumentation and Technology Inc., Sterling, VA) as reported in Tables 4 and 5.

Test Method 1: Transmission, Haze, Clarity, and b* Measurements

The measurement of average % transmission, haze, clarity and b* were conducted with a haze meter (BYK Gardiner, under the trade designation "BYK HAZEGARD Plus, Columbia, MD") based on ASTM D1003-13. Results are recorded in Table 5.

Test Method 2: Viscosity Measurements 17 mL of each ink formulation was loaded into a 25 mm diameter double gap coaxial concentric cylinder apparatus (DIN 53019) on a viscometer (BOHLIN VISCO 88, Malvern Instruments Ltd, Malvern, U.K.). A thermal jacket equipped to the double gap cell allowed for the flow of recirculating water heated to 25° C. and 35° C., respectively. The system was allowed to equilibrate for 30 minutes prior to taking each measurement. The shear rate was ramped from 100 to 1000 Hz at 100 Hz intervals, and the measurement was repeated three times. An average and standard deviation across all data points was taken as the viscosity, in units of centipoise. Results are recorded in Table 3.

Test Method 3: Atomic Force Microscopy Measurements (AFM) Samples of the cured resins in between substrate S1 were cross-sectioned at room temperature using a Leica EM UC6 Microtome. Atomic Force Microscopy was used to image the cross-sections of the phase separating ink coatings. Imaging was performed on a Bruker Dimension Icon microscope (Bruker Nano Inc., 112 Robin Hill Road, Santa Barbara, CA 93117) operated in Tapping Mode under ambient conditions in air. Bruker OTESPA silicon cantilever tips with an aluminum backside coating were used during operation (nominal spring constant=40 N/m, nominal frequency=300 kHz, nominal tip radius=8 nm). Image sizes were 20×20 microns with 1024×1024 data points. Domain size analysis was conducted on 3 images per sample, at each light intensity. Nanoscope Analysis v1.7 (Bruker, Santa Barbara, CA) software was used to get precise measurements of the domain sizes of each measurement. The average and standard deviation were recorded and tabulated in Table 4.

Test Method 4: Atomic Force Microscopy—Infrared Spectroscopy (AFM-IR)

Samples were cryo-microtomed to obtain 250 nm cross-section slides for AFM-IR study. Cryo-microtoming was performed with a Leica Ultramicrotome EM UC7 unit at −40° C. The cross-section slices were then transferred onto a 10 mm×10 mm ZnS single crystal flat for AFM-IR test.

The AFM-IR experiments were carried out with a nanoIR2-FS platform (Bruker Anasys, Santa Barbara, CA). A gold-coated SiN AFM tip (Anasys Instruments) with a nominal tip radius of 20 nm was used to examine the thin cross-section slices in contact mode. The repetition rate of the IR laser was tuned to match the 2$^{nd}$ contact resonance of the AFM cantilever to enhance the sensitivity. All measurements were carried out under ambient conditions.

The cross-section of the film samples was IR-mapped at two characteristic laser frequencies, 1730 cm$^{-1}$ and 1210 cm$^{-1}$, which are characteristic IR absorption bands of methacrylate and fluoroelastomer, respectively.

Examples

Formulation

Stock solutions of neat fluoroelastomer in each of the methacrylate monomers were produced. The fluoroelastomer pieces were cut from a larger block into small 2×2 mm squares and added into each of the neat methacrylate monomers in an amber vial. The vials were placed on a roller for two days or until a clear homogenous solution was formed. Aliquots from the stock solution bottles were taken out and mixed with the other components. An 80:20 mol:mol ratio of monofunctional:difunctional monomers was used for the photocurable portions of the formulation, for the majority of the examples. The photoinitiator (PH1) and spacer beads (B1) were added relative to the total weight of the fluoropolymer/monomer solution. The solutions were sonicated for 30 minutes, or until a homogenous blend was formed. See Table 2 for the formulations used for each example.

TABLE 2

Table of Formulations

| Example | Fluoropolymer | | | | Weight % | | | | |
|---------|---------------|----|----|----|----|----|-----|-----|
| # | Name | Fluoropolymer | M1 | M2 | M3 | M4 | M5 | PH1 | B1 |
| E1 | P1 | 10.0 | 65.7 | 24.3 | | | | 0.5 | 2.5 |
| E2 | P1 | 5.00 | 76.0 | 19.0 | | | | 0.5 | 2.5 |
| E3 | P1 | 2.00 | 78.4 | 19.6 | | | | 0.5 | 2.5 |
| E4 | P1 | 5.0 | 62.5 | 26.2 | | | 2.8 | | |
| E5 | P1 | 10.0 | — | — | 66.0 | 24.0 | | 0.5 | 2.5 |
| E6 | P3 | 10.0 | 65.7 | 24.3 | | | | 0.5 | 2.5 |
| E7 | P2 | 10.0 | 65.7 | 24.3 | | | | 0.5 | 2.5 |
| CE1 | N/A | | 72.8 | 27.2 | | | | 0.5 | 2.5 |
| CE2 | N/A | — | — | — | 73.4 | 26.6 | | 0.5 | 2.5 |

TABLE 3

Viscosity data of uncured inks

| Example # | Viscosity 25° C. (cPs) | | Viscosity 35° C. (cPs) | |
|-----------|------|--------|------|--------|
| | Avg | St. Dev | Avg | St. Dev |
| E1 | 93.6 | 7.24 | 69.3 | 3.91 |
| E2 | 22.8 | 1.15 | 16.7 | 1.17 |
| E3 | 115.0 | 102.0 | 113.9 | 101.7 |
| E4 | 27.6 | 0.84 | 24.61 | 1.08 |
| E5 | 97.47 | 7.78 | 75.36 | 4.88 |

TABLE 3-continued

Viscosity data of uncured inks

| Example # | Viscosity 25° C. (cPs) | | Viscosity 35° C. (cPs) | |
|-----------|------|--------|------|--------|
| | Avg | St. Dev | Avg | St. Dev |
| E6 | 52.0 | 2.10 | 38.9 | 0.95 |
| E7 | 774.9 | 46.8 | 607.7 | 25.2 |
| CE1 | 4.70 | 1.31 | 4.30 | 0.92 |
| CE2 | 4.22 | 1.06 | 3.55 | 1.04 |

TABLE 4

Domain size measurements of formulations after curing

| Example # | Light Intensity (mW/cm$^2$) | Average Domain Size (um) | St. Dev Domain Size (um) | Comments |
|-----------|------|------|------|----------|
| E1 | 0.03 | 3.32 | 1.52 | Circular and oblong domains |
| | 38.3 | 3.02 | 0.81 | Circular domains |
| | 95.6 | 1.51 | 0.32 | Circular domains that are clumped |
| E2 | 0.03 | 2.73 | 0.59 | Scattered circular islands with internal circular domains |
| | 38.3 | 0.83 | 0.52 | Scattered circular islands with internal spherical domains |
| | 95.6 | 1.13 | 1.23 | Island formation with circular domain formation |
| E3 | 1.86 | 0.54 | 0.20 | Scattered circular and oblong domains |
| | 38.3 | 0.31 | 0.13 | Scattered circular and oblong domains |
| | 95.6 | 0.43 | 0.18 | Scattered circular domains |
| E4 | 0.03 | 3.16 | 1.34 | Island formation with clumped domains |
| | 38.3 | 0.81 | 0.24 | Island formation with circular domains |
| | 95.6 | 0.63 | 0.16 | clumped domains |
| E5 | 0.03 | 0.43 | 0.09 | Clumped circular domains |
| | 95.6 | 0.55 | 0.16 | Clumped circular domains |
| E6 | 0.03 | 2.00 | 1.68 | Circular domains |
| | 38.3 | 3.07 | 0.81 | Circular and oblong domains |
| | 95.6 | 4.10 | 0.41 | Irregular shape domains |
| E7 | 0.03 | 2.29 | 0.37 | Clumped spherical domains |
| | 38.3 | 1.18 | 0.30 | Some clumped domains some circular domains |
| | 95.6 | 1.04 | 0.26 | Oblong domains with less clumping |
| CE1 | 0.03 | N/A | N/A | No domain structure observed |
| | 38.3 | N/A | N/A | No domain structure observed |
| | 95.6 | N/A | N/A | No domain structure observed |
| CE2 | 0.03 | N/A | N/A | No domain structure observed |
| | 38.3 | N/A | N/A | No domain structure observed |
| | 95.6 | N/A | N/A | No domain structure observed |

TABLE 5

| Example # | Thickness (μm) | Light Intensity (mW/cm²) | % $T_{avg}$ | % $T_{stdev}$ | % $H_{avg}$ | % $H_{avg}$/um | % $H_{stdev}$ | % $C_{avg}$ | % $C_{stdev}$ |
|---|---|---|---|---|---|---|---|---|---|
| E1 | 14 | 0.03 | 88.40 | 13.20 | 48.40 | 3.46 | 30.60 | 96.40 | 0.90 |
|  |  | 38.30 | 80.50 | 8.00 | 77.60 | 5.54 | 1.40 | 91.50 | 0.92 |
|  |  | 95.60 | 92.50 | 2.64 | 23.90 | 1.71 | 5.83 | 98.60 | 0.06 |
| E2 | 10 | 0.03 | 94.50 | 1.35 | 47.90 | 4.79 | 2.16 | 73.70 | 0.12 |
|  |  | 38.30 | 94.80 | 0.20 | 10.20 | 1.02 | 12.60 | 67.10 | 3.69 |
|  |  | 95.60 | 94.80 | 0.06 | 0.94 | 0.09 | 0.96 | 99.70 | 0.06 |
| E3 | 5 | 0.03 | 94.50 | 0.21 | 7.81 | 1.56 | 5.08 | 98.90 | 0.00 |
|  |  | 38.30 | 94.30 | 0.56 | 0.56 | 0.11 | 0.42 | 99.70 | 0.00 |
|  |  | 95.60 | 93.80 | 0.26 | 2.82 | 0.56 | 1.98 | 99.50 | 0.06 |
| E4 | 5 | 0.03 | 96.60 | 0.15 | 64.60 | 12.92 | 6.13 | 26.50 | 0.61 |
|  |  | 38.30 | 94.20 | 0.78 | 54.50 | 10.90 | 38.60 | 15.00 | 0.35 |
|  |  | 95.60 | 94.20 | 0.99 | 16.10 | 3.22 | 5.95 | 24.90 | 0.75 |
| E5 | 15 | 0.03 | 92.20 | 0.31 | 5.41 | 0.36 | 1.48 | 99.70 | 0.06 |
|  |  | 38.30 | 92.40 | 0.35 | 0.26 | 0.02 | 0.03 | 99.60 | 0.00 |
|  |  | 95.60 | 92.20 | 1.80 | 1.84 | 0.12 | 1.53 | 99.80 | 0.06 |
| E6 | 9 | 1.86 | 93.70 | 0.21 | 40.10 | 4.46 | 5.69 | 40.30 | 1.70 |
|  |  | 76.60 | 94.40 | 0.31 | 37.30 | 4.14 | 18.50 | 44.10 | 5.81 |
|  |  | 90.00 | 93.70 | 0.67 | 75.10 | 8.34 | 2.84 | 69.40 | 2.50 |
| E7 | 10 | 0.03 | 93.80 | 1.50 | 15.90 | 1.59 | 17.30 | 96.80 | 0.20 |
|  |  | 38.30 | 94.70 | 0.69 | 15.20 | 1.52 | 2.22 | 96.40 | 0.17 |
|  |  | 95.60 | 93.30 | 0.60 | 9.70 | 0.97 | 4.89 | 98.30 | 0.35 |
| CE1 | 10 | 0.03 | 93.90 | 0.38 | 0.36 | 0.04 | 0.09 | 99.10 | 0.10 |
|  |  | 38.30 | 94.40 | 0.25 | 0.21 | 0.02 | 0.04 | 99.80 | 0.06 |
|  |  | 95.60 | 94.10 | 0.30 | 0.16 | 0.02 | 0.06 | 99.80 | 0.06 |
| CE2 | 15 | 0.03 | 93.80 | 0.27 | 0.40 | 0.03 | 0.75 | 100.00 | 0.13 |
|  |  | 38.30 | 93.80 | 0.27 | 0.40 | 0.03 | 0.75 | 100.00 | 0.13 |
|  |  | 95.60 | 93.80 | 0.27 | 0.40 | 0.03 | 0.75 | 100.00 | 0.13 |

AFM and AFM-IR Images

Figure 10:
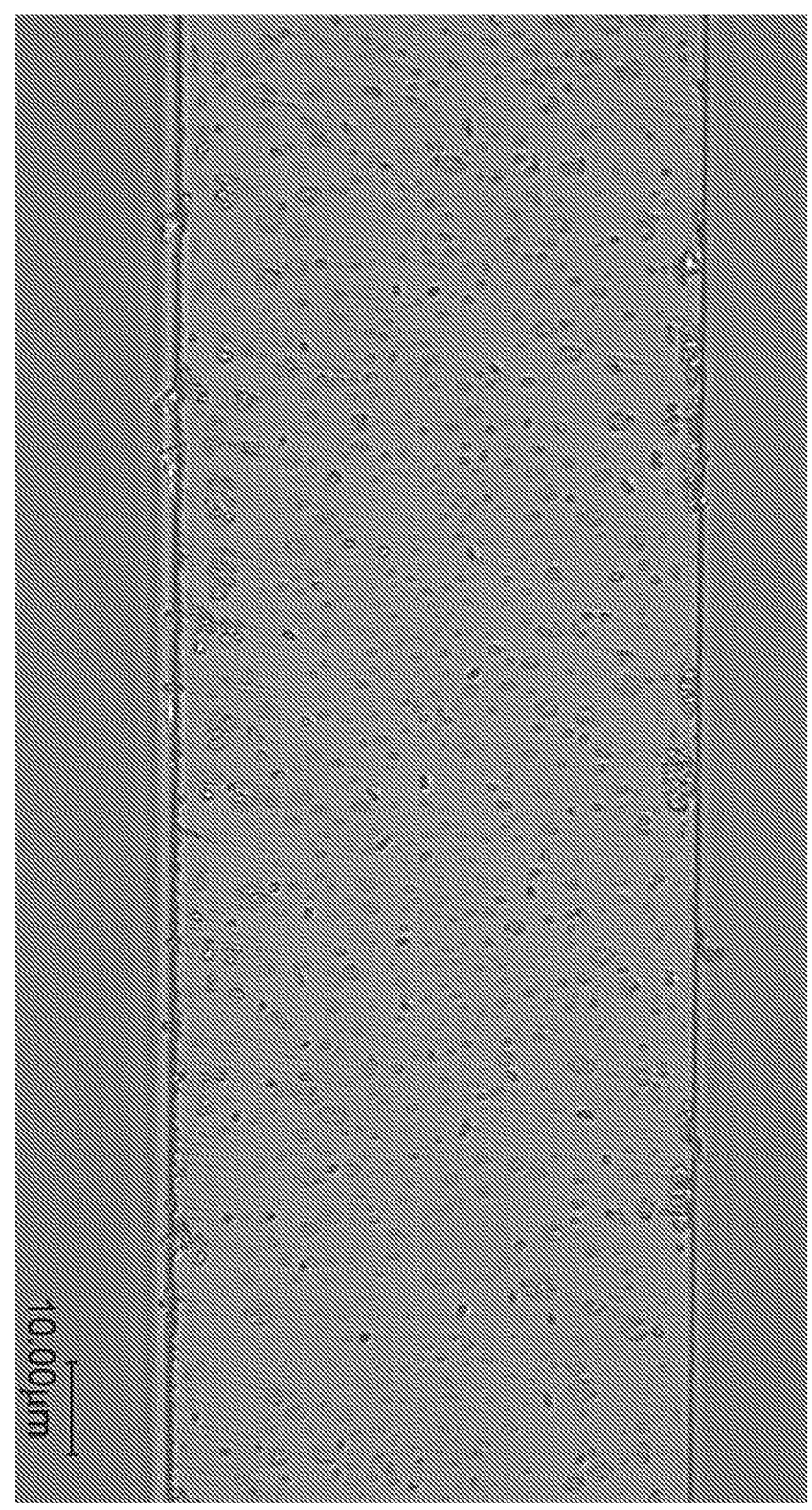
FIG. 10 shows a cross sectional view of an optical microscope view of the optically-light scattering layer of Example 2.
Figure 11A:
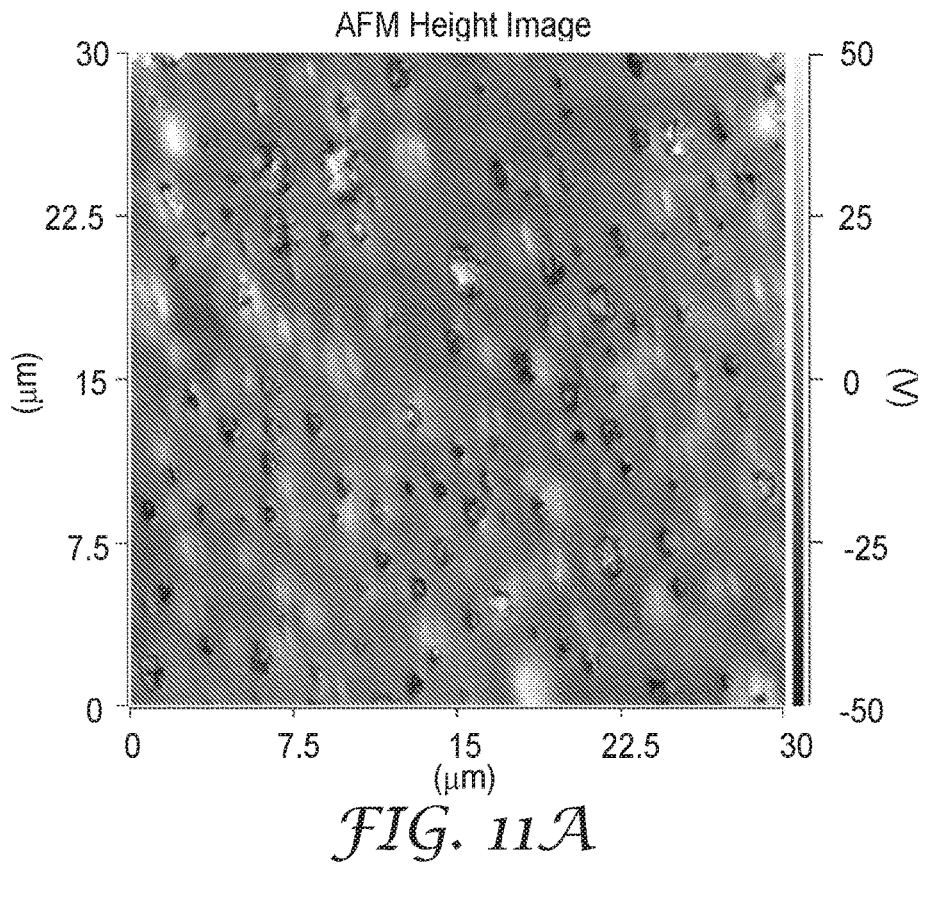
FIG. 11A shows a cross sectional view of an AFM Height Image of the optically-light scattering layer of Example 2.
Figure 11B:
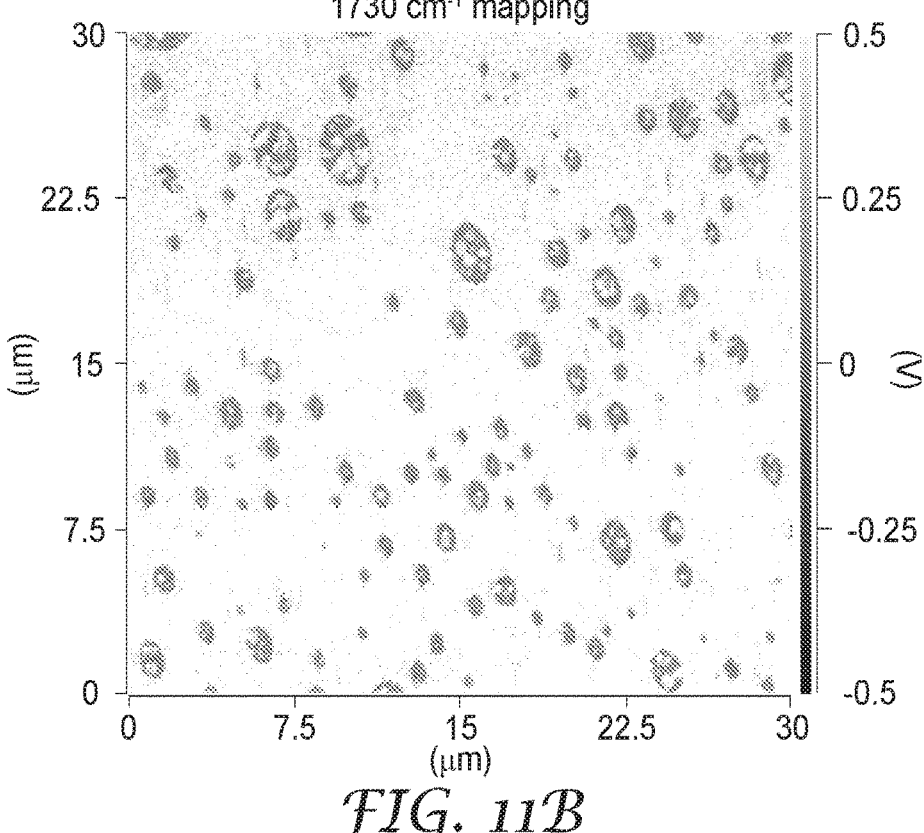
FIG. 11B shows a cross sectional view of an AFM-IR map of the optically-light scattering layer of Example 2.
Figure 11C:
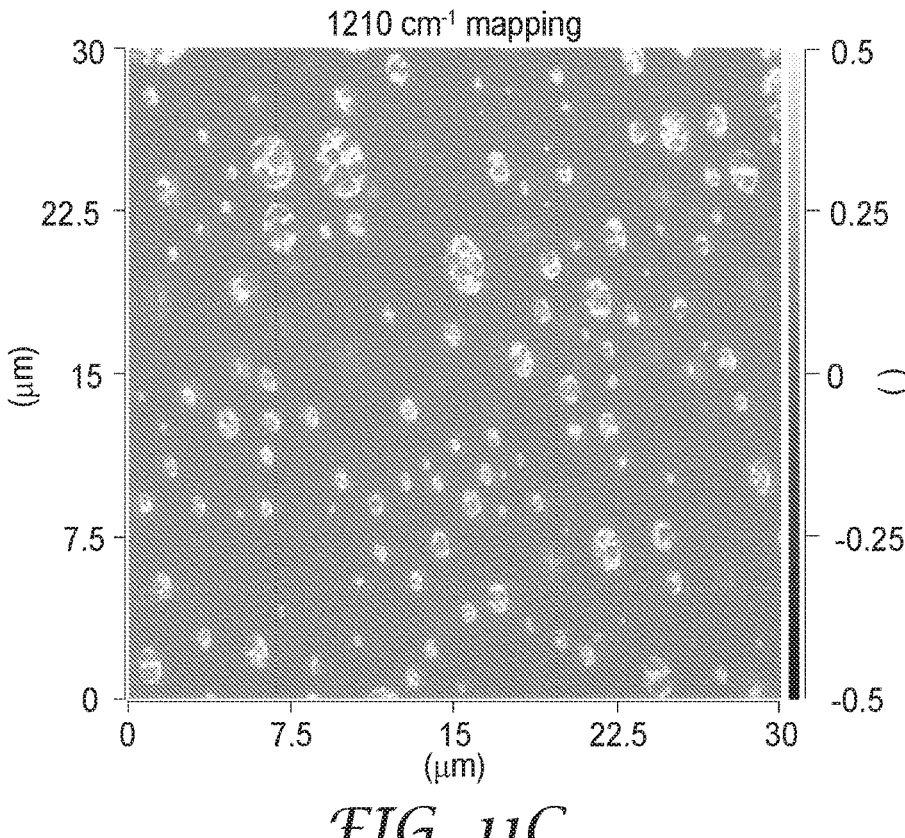
FIG. 11C shows a cross sectional view of an AFM-IR map of the optically-light scattering layer of Example 2.
Figure 11D:
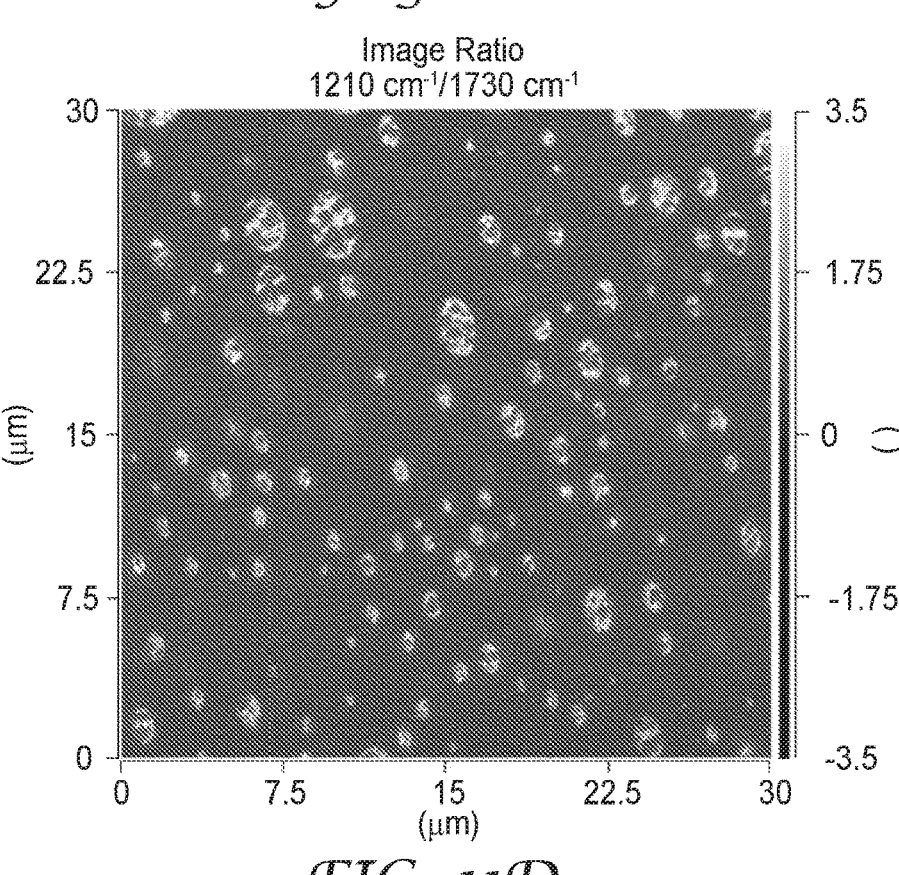
FIG. 11D shows a cross sectional view of an AFM-IR Image Ratio map of the optically-light scattering layer of Example 2.
Figure 12:
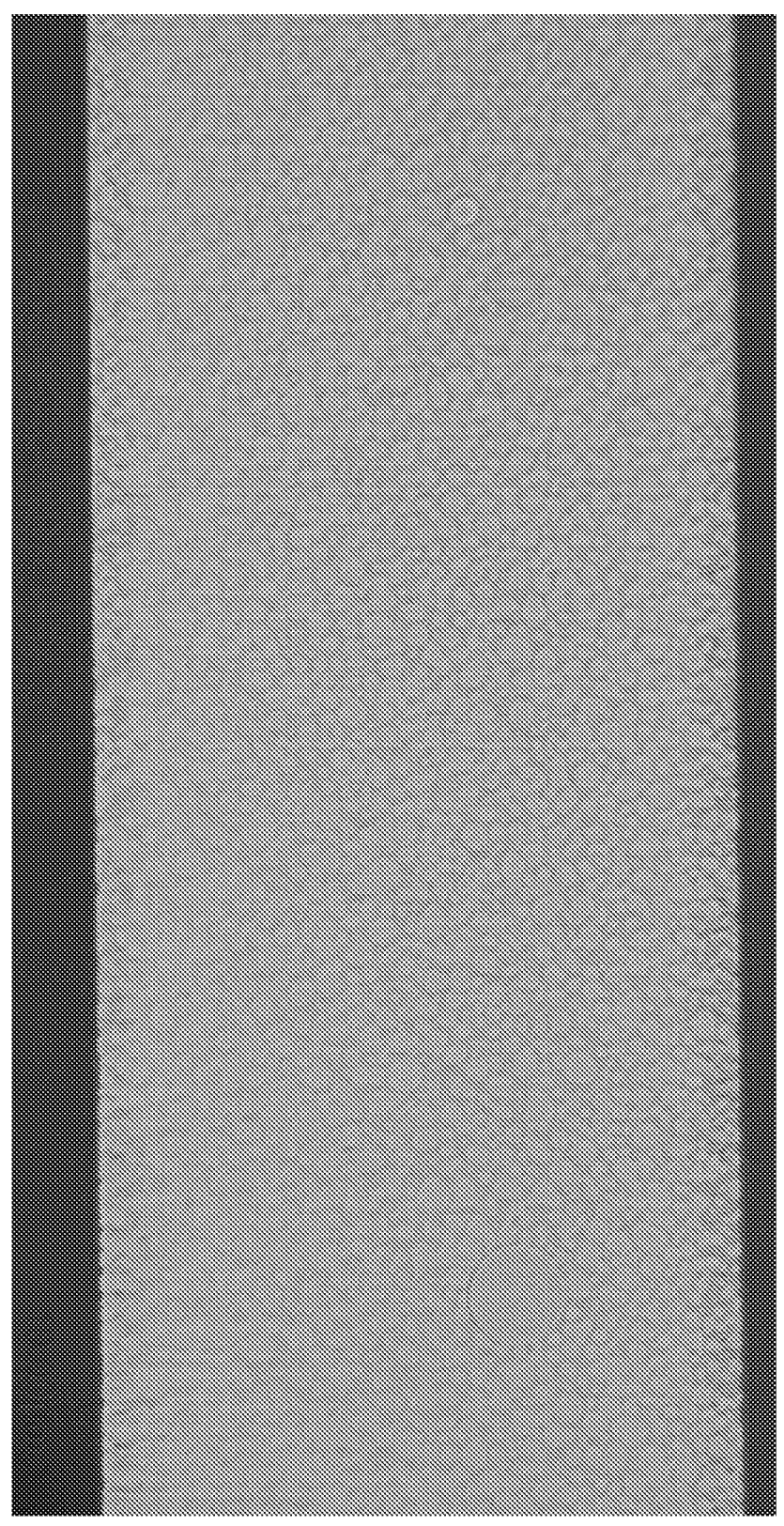
FIG. 12 shows a cross sectional view of an optical microscope image of the optically-light scattering layer of Example 1.
Figure 13A:
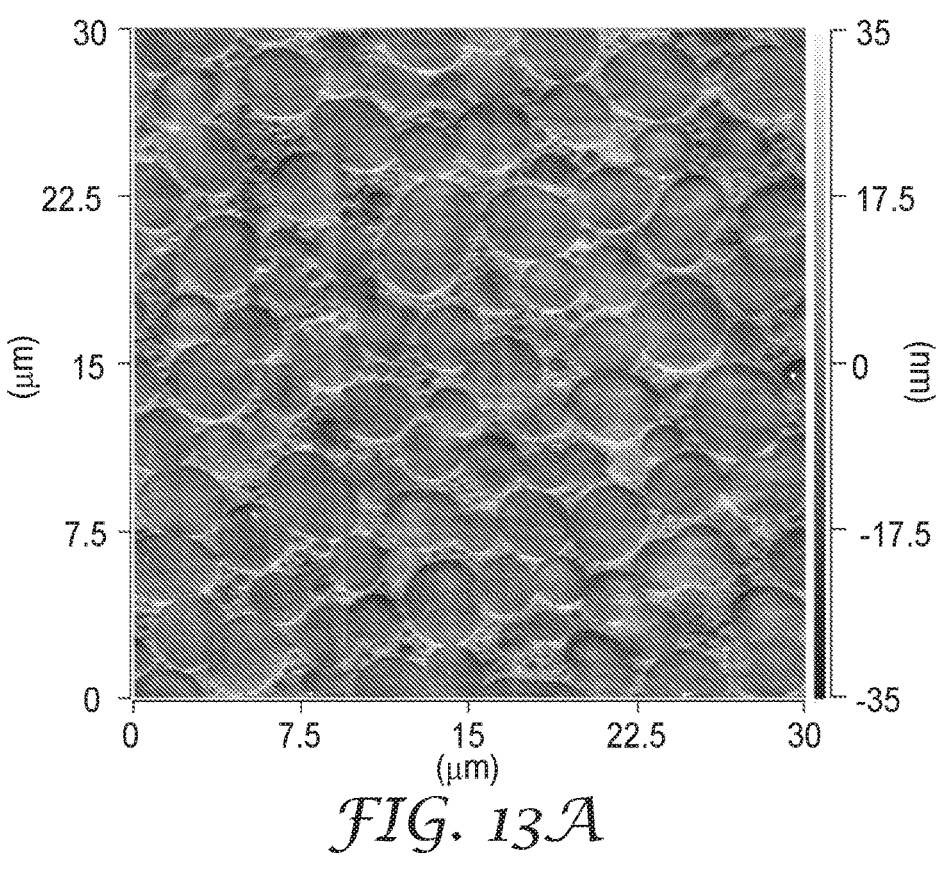
FIG. 13A shows a cross sectional view of an AFM Height Image of the optically-light scattering layer of Example 1.
Figure 13B:
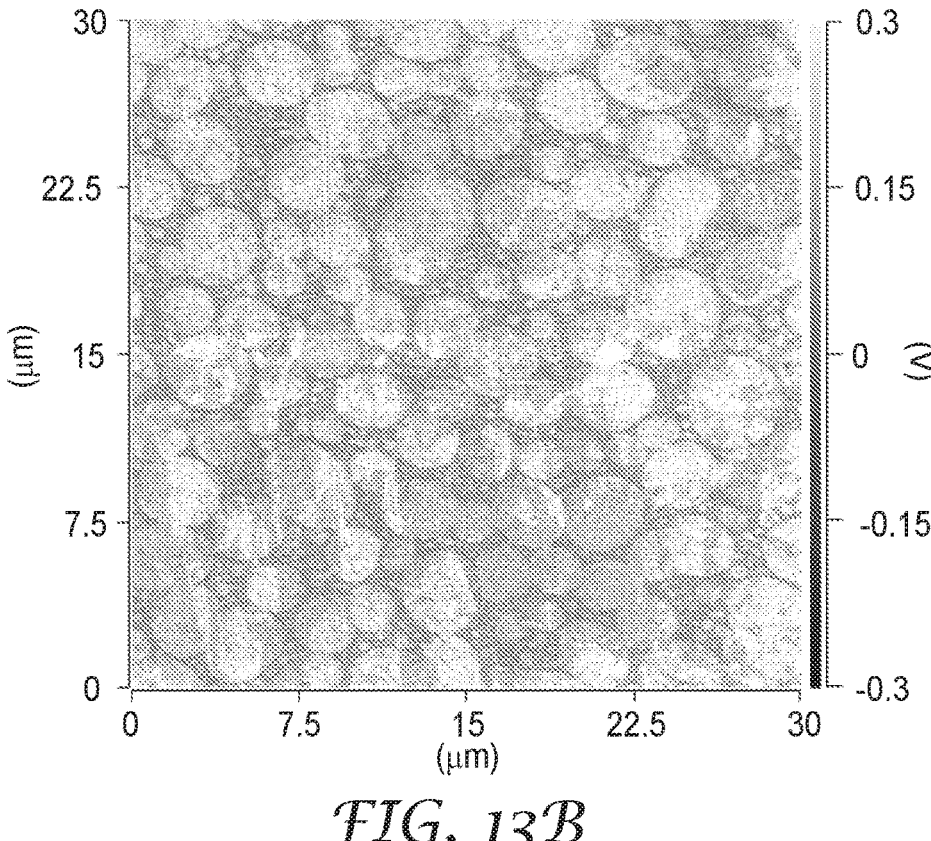
FIG. 13B shows a cross sectional view of an AFM-IR map of the optically-light scattering layer of Example 1.
Figure 13C:
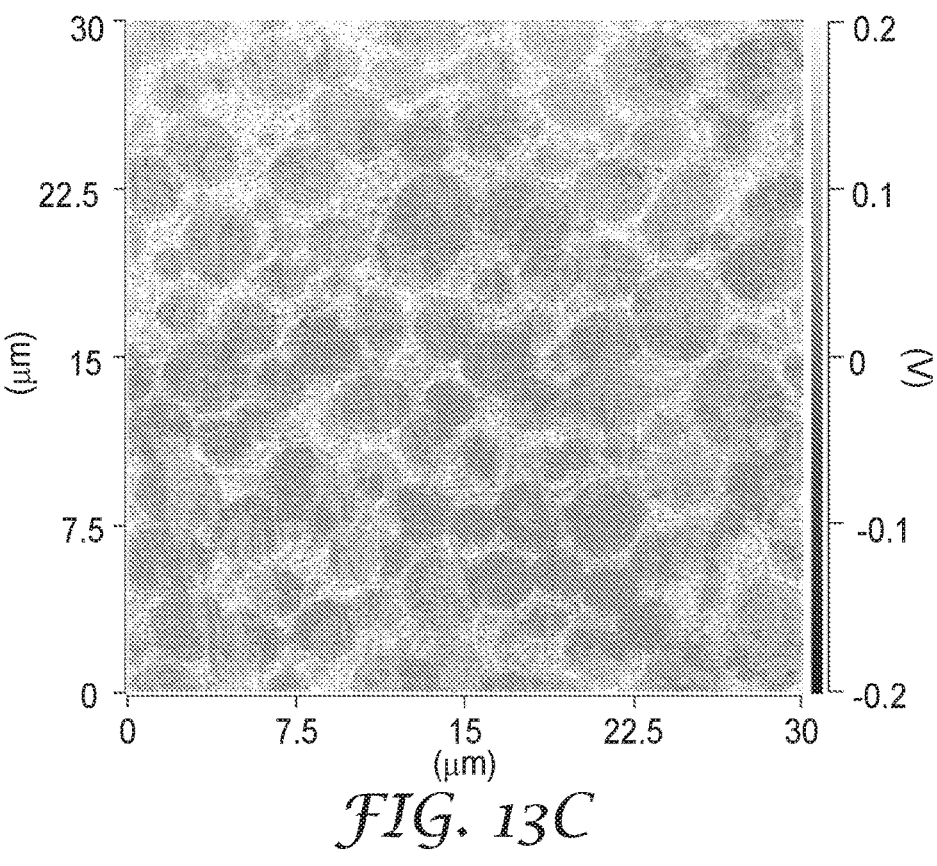
FIG. 13C shows a cross sectional view of an AFM-IR map of the optically-light scattering layer of Example 1.
Figure 13D:
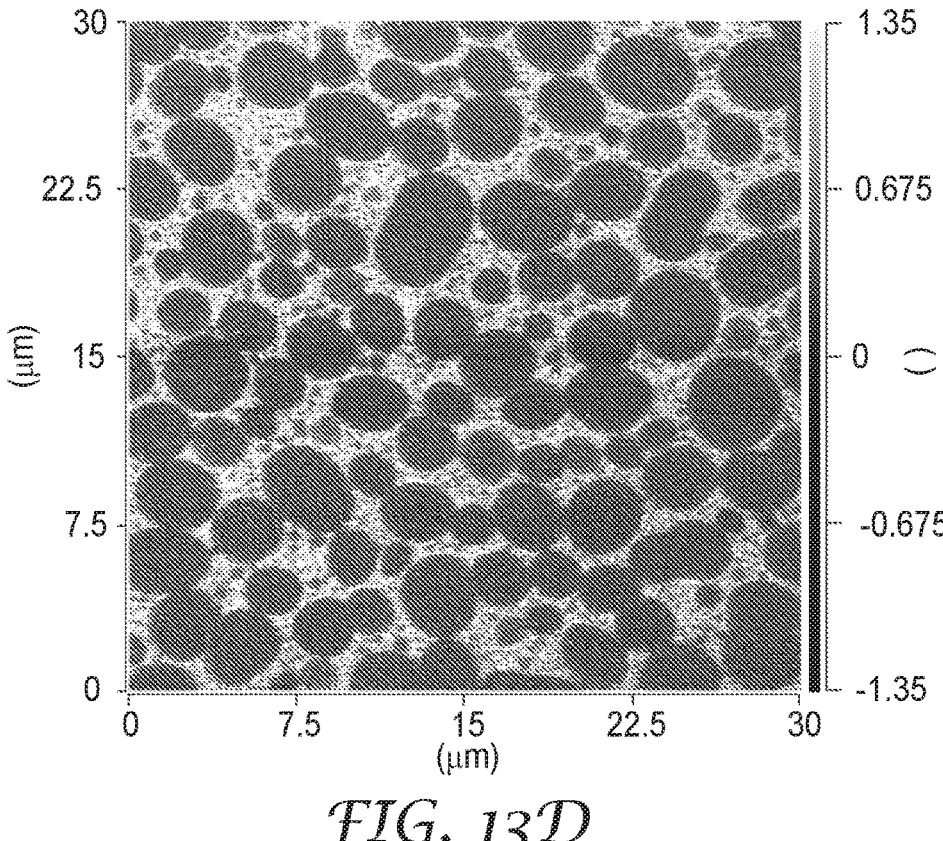
FIG. 13D shows a cross sectional view of an AFM-IR Image Ratio map of the optically-light scattering layer of Example 1.

FIGS. 10 and 12 show optical micrographs of the cross-sections of the films created in Example 2 and Example 1 respectively, and analyzed via Test Method 3: Atomic Force Microscopy. The Atomic Force Microscopy IR mappings clearly show the spatial distribution of methacrylate and fluoropolymer, confirming distinct phase separation. AFM-IR technique was used to map the chemical components on a 30 μm×30 μm area of this cross-section while fixing the frequency of the IR laser at 1730 cm$^{-1}$ and 1210 cm$^{-1}$, respectively. The IR mapping at 1730 cm$^{-1}$ and 1210 cm$^{-1}$ are depicted in FIGS. 11B and 11C. FIG. 11A shows the AFM topographic mapping obtained simultaneously with the IR mapping. FIG. 11B and FIG. 11C clearly identify a distinct chemical separation between the fluoropolymer and methacrylate phases. The matrix of the image in FIG. 11B is lighter in color on the data scale, indicating a higher IR absorption of this region at 1730 cm$^{-1}$, which corresponds to the C=O (carbonyl chemical moiety) stretching mode in the methacrylate phase. FIG. 11C identifies these microdomains as having a higher IR absorption at 1210 cm$^{-1}$, corresponding to the C—F stretching mode in the fluoroelastomer phase. This color inversion between FIGS. 11B and 11C suggests that the matrix is rich in methacrylate while the microdomains are rich in fluoroelastomer. In addition, a closer look inside the fluoroelastomer-rich microdomains reveals nanodomains of methacrylate phase, indicating a more complex phase separation phenomenon. In order to eliminate the topography-induced image artifacts, the absorption intensity ratio of the IR mappings was calculated. The absorption intensity ratio of the IR mappings was calculated using the built-in software of the nanoIR2-FS equipment (Bruker Anasys, Santa Barbara, CA). The ratio of the absorption at the two IR laser frequencies was calculated for every pixel on the mapping. FIG. 11D shows the absorption intensity ratio of the 1210 cm$^{-1}$ mapping over the 1730 cm$^{-1}$ mapping. The largely-improved contrast clearly depicts the phase separation morphology of methacrylate and fluoropolymer. Similarly, FIG. 13 shows the topographic mapping and chemical mapping of Example 1. As shown in the two IR mappings (FIGS. 13B and 13C) and the image ratio (FIG. 13D), the spherical methacrylate-rich domains are dispersed in fluoroelastomer-rich matrix, which is the exact opposite of the phase separation morphology in FIG. 1I.

What is claimed is:

1. An information display system, comprising:
a pixelated display including a plurality of pixels, each pixel including a plurality of subpixels;
an inter-pixel region defined between two of the subpixels;
at least one subpixel zone;
an optically-scattering layer in optical communication with the pixelated display, the optically-scattering layer including:
a matrix; and
phase-separated microdomains, wherein the matrix and the phase-separated microdomains have different refractive indices;
wherein the phase-separated microdomains are disposed in at least one subpixel zone,
wherein phase-separated microdomains in a first subpixel zone have an average diameter substantially different than that of phase-separated microdomains in a second subpixel zone, and phase-separated microdomains in the first and second subpixel zones have average diameters substantially different than that of phase-separated microdomains in a third subpixel zone.

2. The information display system of claim 1, further including two thin-film encapsulation layers, and wherein the phase-separated microdomains are disposed between the thin-film encapsulation layers.

3. The information display system of claim 1, further including two thin-film encapsulation layers, and wherein thin-film encapsulation layers are disposed between the phase-separated microdomains and the pixelated display.

4. The information display system of claim 1, wherein the pixelated display is an organic light emitting diode display.

5. The information display system of claim 1, wherein phase-separated microdomains are disposed in each sub-pixel zone.

6. The information display system of claim 1, wherein a number of phase-separated microdomains in the first sub-pixel zone is substantially different than that of phase-separated microdomains in the second subpixel zone.

7. The information display system of claim 1, wherein a number of phase-separated microdomains in the first sub-pixel zone is substantially different than that of phase-separated microdomains in the second subpixel zone, and the numbers of phase-separated microdomains in the first and second subpixel zones are substantially different than that of phase-separated microdomains in the third subpixel zone.

8. The information display system of claim 1, wherein at least one subpixel zone includes phase-separated microdomains and another subpixel zone does not include phase-separated microdomains.

9. The information display system of claim 1, wherein the optically-scattering layer includes a curable composition comprising:

at least one fluoropolymer;
at least one monofunctional (meth)acrylate;
at least one difunctional (meth)acrylate; and
at least one initiator.

10. An information display system, comprising:

a pixelated display including a plurality of pixels, each pixel including a plurality of subpixels;
an inter-pixel region defined between two of the subpixels;
at least one subpixel zone;
an optically-scattering layer in optical communication with the pixelated display, the optically-scattering layer including:
a matrix; and
phase-separated microdomains, wherein the matrix and the phase-separated microdomains have different refractive indices;
wherein the phase-separated microdomains are disposed in at least one subpixel zone,
wherein a number of phase-separated microdomains in a first subpixel zone is substantially different than that of phase-separated microdomains in a second subpixel zone.

11. The information display system of claim 10, wherein the numbers of phase-separated microdomains in the first and second subpixel zones are substantially different than that of phase-separated microdomains in a third subpixel zone.

12. The information display system of claim 10, wherein at least one subpixel zone includes phase-separated micro-domains and another subpixel zone does not include phase-separated microdomains.

13. The information display system of claim 10, further including two thin-film encapsulation layers, and wherein the phase-separated microdomains are disposed between the thin-film encapsulation layers.

14. The information display system of claim 10, further including two thin-film encapsulation layers, and wherein thin-film encapsulation layers are disposed between the phase-separated microdomains and the pixelated display.

15. The information display system of claim 10, wherein the pixelated display is an organic light emitting diode display.

16. An information display system, comprising:

a pixelated display including a plurality of pixels, each pixel including a plurality of subpixels;
an inter-pixel region defined between two of the subpixels;
at least one subpixel zone;
an optically-scattering layer in optical communication with the pixelated display, the optically-scattering layer including:
a matrix; and
phase-separated microdomains, wherein the matrix and the phase-separated microdomains have different refractive indices;
wherein the phase-separated microdomains are disposed in at least one subpixel zone,
wherein at least one subpixel zone includes phase-separated microdomains and another subpixel zone does not include phase-separated microdomains.

17. The information display system of claim 16, wherein all phase-separated microdomains have substantially the same diameter.

18. The information display system of claim 16, wherein phase-separated microdomains in a first subpixel zone have an average diameter substantially different than that of phase-separated microdomains in a second subpixel zone.

19. The information display system of claim 16, further including two thin-film encapsulation layers, and wherein the phase-separated microdomains are disposed between the thin-film encapsulation layers.

20. The information display system of claim 16, further including two thin-film encapsulation layers, and wherein thin-film encapsulation layers are disposed between the phase-separated microdomains and the pixelated display.

* * * * *